(12) United States Patent
Idani

(10) Patent No.: US 7,879,724 B2
(45) Date of Patent: Feb. 1, 2011

(54) METHOD OF MANUFACTURING A SEMICONDUCTOR DEVICE AND A SEMICONDUCTOR MANUFACTURING EQUIPMENT

(75) Inventor: Naoki Idani, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 312 days.

(21) Appl. No.: 12/052,288

(22) Filed: Mar. 20, 2008

(65) Prior Publication Data

US 2008/0233753 A1 Sep. 25, 2008

(30) Foreign Application Priority Data

Mar. 20, 2007 (JP) ............... 2007-073644

(51) Int. Cl.
*H01L 21/302* (2006.01)
*H01L 21/461* (2006.01)

(52) U.S. Cl. ............. 438/692; 134/26; 257/E21.228; 257/E21.251; 438/745; 438/906

(58) Field of Classification Search ............ 134/26; 257/E21.228, E21.251; 438/692, 745, 906
See application file for complete search history.

(56) References Cited

U.S. PATENT DOCUMENTS

| | | | |
|---|---|---|---|
| 5,868,863 A * | 2/1999 | Hymes et al. ............ 134/28 |
| 6,171,514 B1 * | 1/2001 | Hara et al. ............... 216/89 |
| 6,258,697 B1 * | 7/2001 | Bhakta et al. ............ 438/437 |
| 7,196,011 B2 | 3/2007 | Cho et al. | |
| 2001/0054431 A1 * | 12/2001 | Masui et al. ............ 134/3 |
| 2005/0153557 A1 | 7/2005 | Cho et al. | |

FOREIGN PATENT DOCUMENTS

| JP | 2002-237030 A | 8/2002 |
|---|---|---|
| JP | 2003-71714 A | 3/2003 |
| JP | 2004-228265 A | 8/2004 |
| KR | 2005-108915 A | 11/2005 |

OTHER PUBLICATIONS

Chinese Office Action dated Aug. 21, 2009, issued in corresponding Chinese Patent Application No. 200810087121.9.
Korean Office Action dated Jan. 21, 2010 issued in corresponding Korean Patent Application No. 10-2008-25158.

* cited by examiner

Primary Examiner—Asok K Sarkar
(74) Attorney, Agent, or Firm—Fujitsu Patent Center

(57) ABSTRACT

A method of manufacturing a semiconductor device has polishing a film, and cleaning a polished surface by carrying out a first exposing the polished surface to an acidic first cleaning fluid having an effect of etching at least a partial region of the polished surface, and a second exposing the polished surface to an alkaline second cleaning fluid after the first exposing.

12 Claims, 28 Drawing Sheets

10

US 7,879,724 B2

METHOD OF MANUFACTURING A SEMICONDUCTOR DEVICE AND A SEMICONDUCTOR MANUFACTURING EQUIPMENT

CROSS-REFERENCE TO RELATED APPLICATIONS

This application is based on and claims priority of Japanese Patent Application No. 2007-073644 filed on Mar. 20, 2007, the entire contents of which are incorporated herein by reference.

TECHNICAL FIELD

It is related to a method for manufacturing a semiconductor device and a semiconductor manufacturing equipment.

BACKGROUND

Recently, it has been becoming essential to polish and planarize a surface of an insulating film by chemical mechanical polishing (CMP) in processes of manufacturing semiconductor devices such as LSIs. The reason of the planarization is to secure an exposure margin at the time of exposing a photoresist, and the like. In addition, when conductive plugs are formed in contact holes, CMP of a tungsten film is also carried out to leave the tungsten film only in the contact holes.

Meanwhile, diameters of semiconductor substrates have recently become larger, and wafers of 300 mm diameter have begun to be used in place of the conventional wafers of 200 nm diameter in the manufacturing processes of mass production of the semiconductor devices.

After the CMP, cleaning is carried out on a semiconductor substrate in order to rinse slurry and the like. However, when a conventional cleaning method for wafers with the diameter of 200 mm is used for the large diameter semiconductor substrate, there is a problem that foreign materials remain on the substrate after the cleaning.

SUMMARY

It is an aspect of the embodiments discussed herein to provide a method of manufacturing a semiconductor device having polishing a film, and cleaning a polished surface by carrying out a first exposing the polished surface to an acidic first cleaning fluid having an effect of etching at least a partial region of the polished surface, and a second exposing the polished surface to an alkaline second cleaning fluid after the first exposing.

DETAILED DESCRIPTION OF THE EMBODIMENTS

Firstly, the preliminary explanation of the present embodiments will be described.

Figure 1:
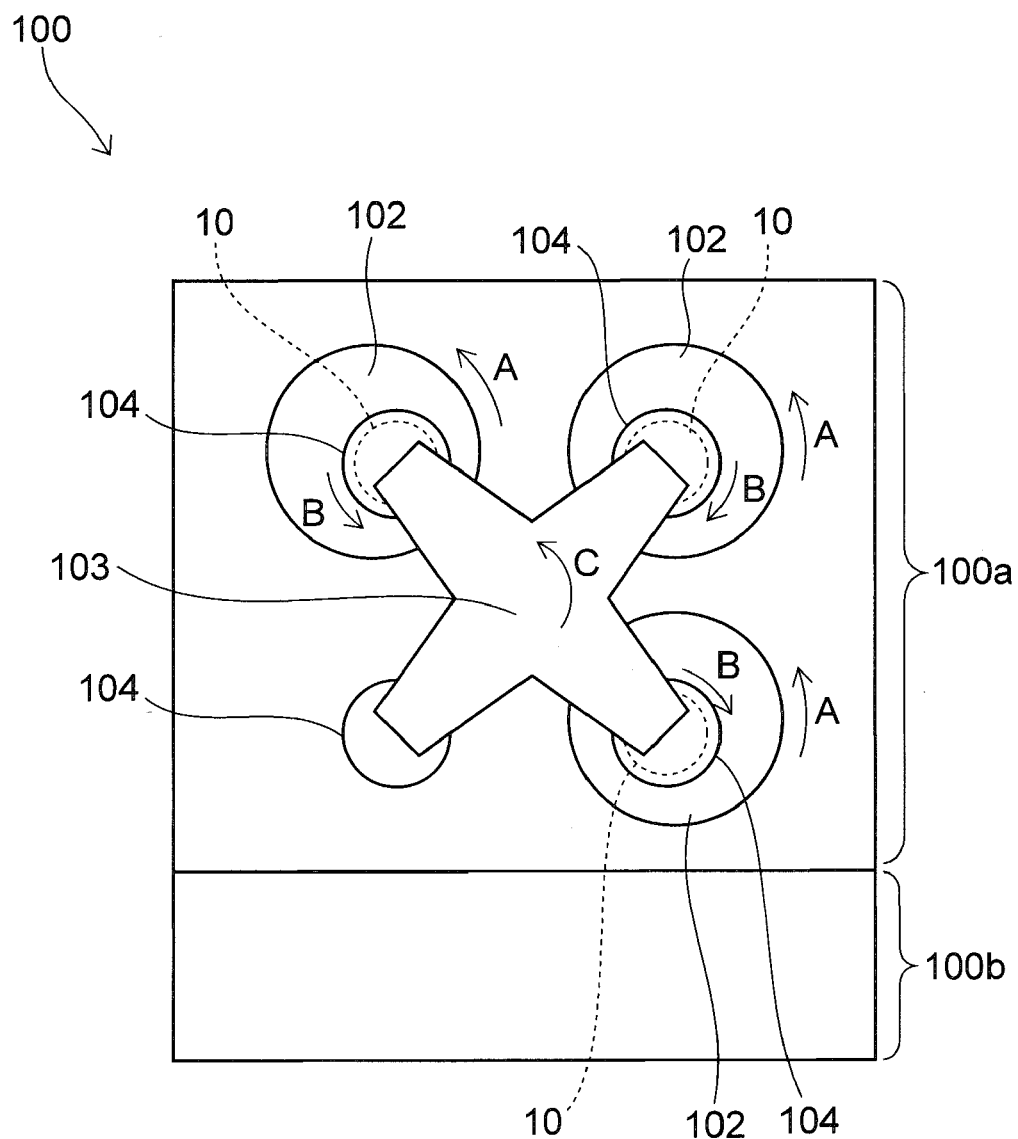
FIG. 1 is a top view of a semiconductor manufacturing equipment according to the preliminary explanation.

FIG. 1 is a top view of a semiconductor manufacturing equipment according to the preliminary explanation.

This semiconductor manufacturing equipment 100 is broadly divided into a polishing unit 100a and a cleaning unit 100b.

The polishing unit 100a includes a carousel 103 and three platens 102. The carousel 103 is provided with four polishing heads 104, and a semiconductor substrate 10, for example a silicon substrate, held by a polishing head 104 is pressed against each of the platens 102.

At the time of polishing, each platen 102 rotates in a direction shown by arrows A, and each polishing head 104 rotates in a direction shown by arrows B. Then, before and after the polishing, the carousel 103 rotates in a direction shown by arrow C to move the silicon substrate 10 from one platen 102 to another platen 102 or to convey the silicon substrate 10 to the cleaning unit 100b.

Figure 2:
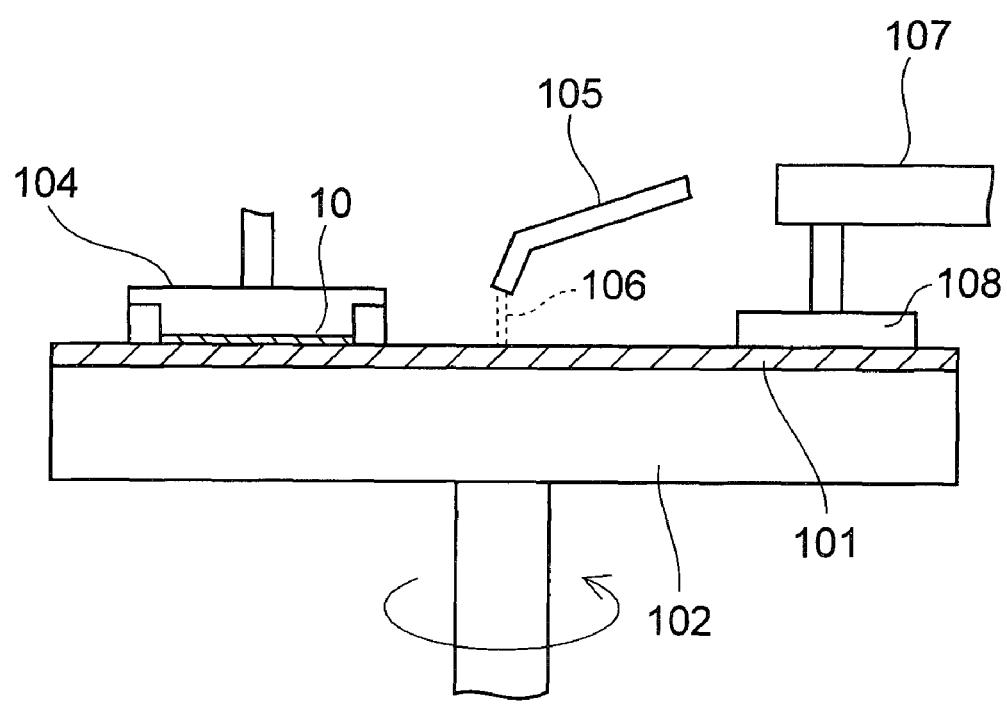
FIG. 2 is a cross-sectional view of a platen and a periphery thereof.

FIG. 2 is a cross-sectional view of one platen 102 and a periphery thereof.

A polishing pad 101 is attached to the platen 102, and the silicon substrate 10 is pressed against the polishing pad 101 by the polishing head 104.

In addition, a slurry supplying nozzle 105 for supplying the polishing pad 101 with a slurry 106 is provided over the polishing pad 101. In the periphery of the polishing pad 101, a pressing device 107 is provided, and the polishing pad 101 is dressed by a diamond disk 108 provided in the pressing device 107.

Figure 3:
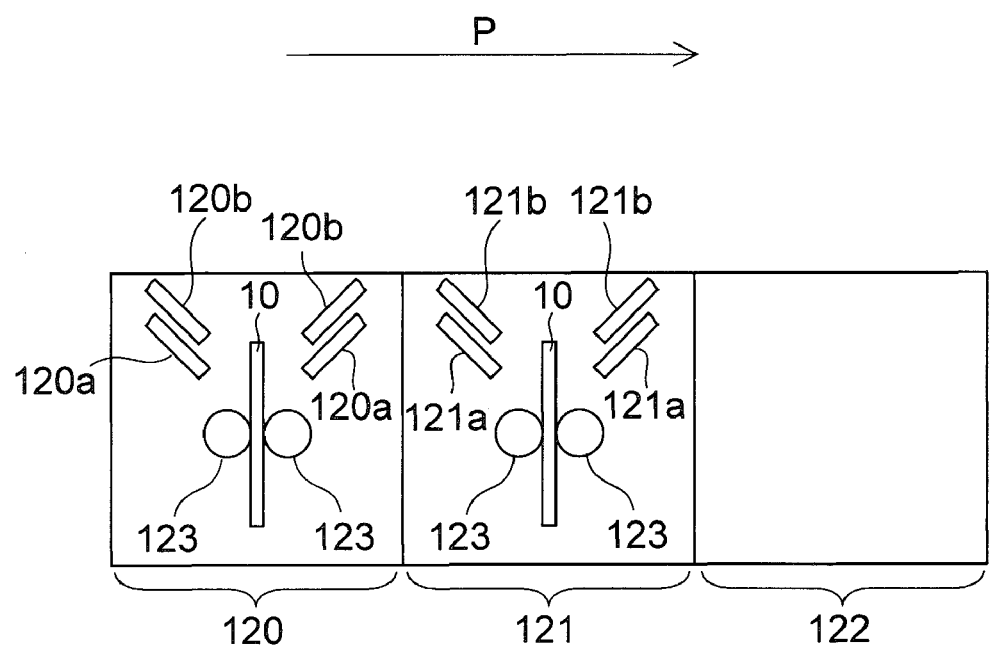
FIG. 3 is a cross-sectional view of a cleaning unit.
Figure 3:

FIG. 3 is a cross-sectional view of the cleaning unit 100b.

The cleaning unit 100b is used to clean the silicon substrate 10 that is subjected to the polishing in the polishing unit 100a, and has an ammonia cleaning tank 120, a hydrofluoric acid cleaning tank 121, and a dryer tank 122.

Among these, the ammonia cleaning tank 120 includes ammonia nozzles 120a for discharging ammonia water, and pure water nozzles 120b for discharging pure water.

In addition, the hydrofluoric acid cleaning tank 121 includes hydrofluoric acid nozzles 121a for discharging hydrofluoric acid, i.e., a solution of hydrogen fluoride (HF), and pure water nozzles 121b for discharging pure water.

Cleaning brushes 123 made of resin, such as polyvinyl alcohol, are provided in each of these cleaning tanks 120 and 121. The cleaning can be carried out by applying these brushes 123 to the substrate 10.

The silicon substrate 10 is conveyed to the ammonia cleaning tank 120 and the hydrofluoric acid cleaning tank 121 in this order along a conveyance path P. After that, the silicon substrate 10 is dried in the dryer tank 122 by IPA (isopropyl alcohol) drying or spin drying.

Figure 4:
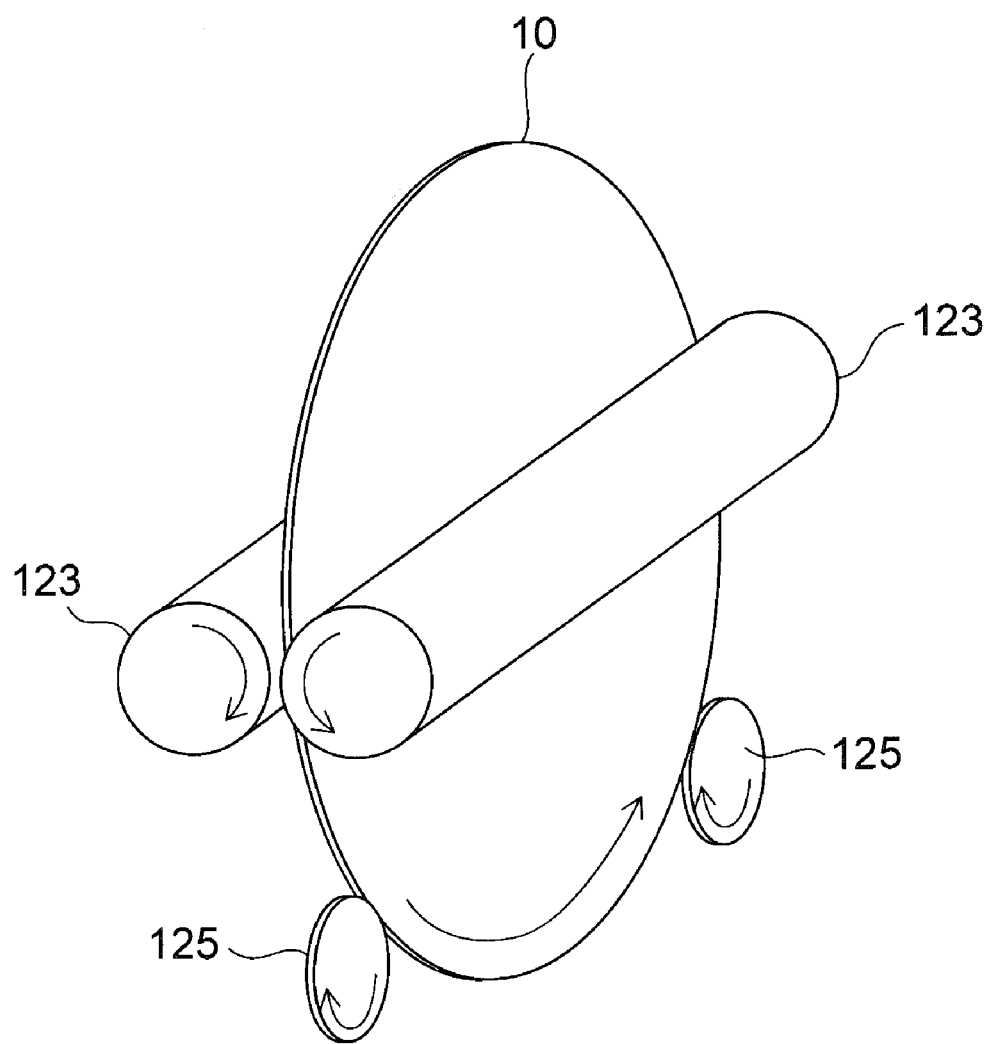
FIG. 4 is an enlarged perspective view of cleaning brushes and a periphery thereof.

FIG. 4 is an enlarged perspective view of the cleaning brushes 123 and a periphery thereof.

As shown in the figure, when the cleaning brushes 123 are applied to the silicon substrate 10, the substrate 10 is stably held by pulleys 125 and rotates by rotational movement of the pulleys 125. Then, by rotating the cleaning brushes 123 while the silicon substrate 10 is being rotated in this manner, an entire surface of the silicon substrate 10 is rubbed by the brushes 123.

Note that it can be arbitrarily set whether to apply the brushes 123 to the silicon substrate 10. Thus, the silicon substrate 10 may be cleaned without applying the brushes 123.

Next, a method for manufacturing a semiconductor device using the above-described semiconductor manufacturing equipment 100 will be described.

FIGS. 5A to 5D are cross-sectional views showing processes of manufacturing the semiconductor device.

Figure 5A:
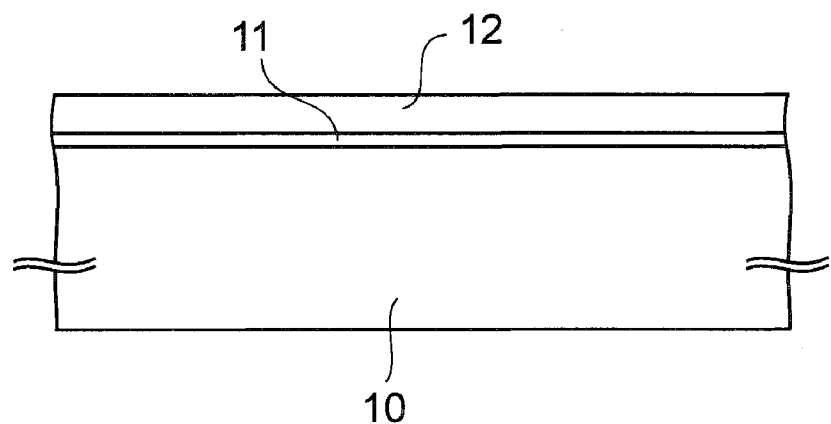
FIGS. 5A to 5D are cross-sectional views for illustrating a method for manufacturing a semiconductor device using the semiconductor manufacturing equipment of FIG. 1.

To manufacture the semiconductor device, as shown in FIG. 5A, a surface of the silicon substrate 10 is thermally oxidized to form a silicon oxide film 11 with a thickness of approximately 10 nm. After that, a silicon nitride film 12 with a thickness of approximately 100 nm is formed on the silicon oxide film 11 by, for example, the chemical vapor deposition (CVD) method.

Figure 5B:
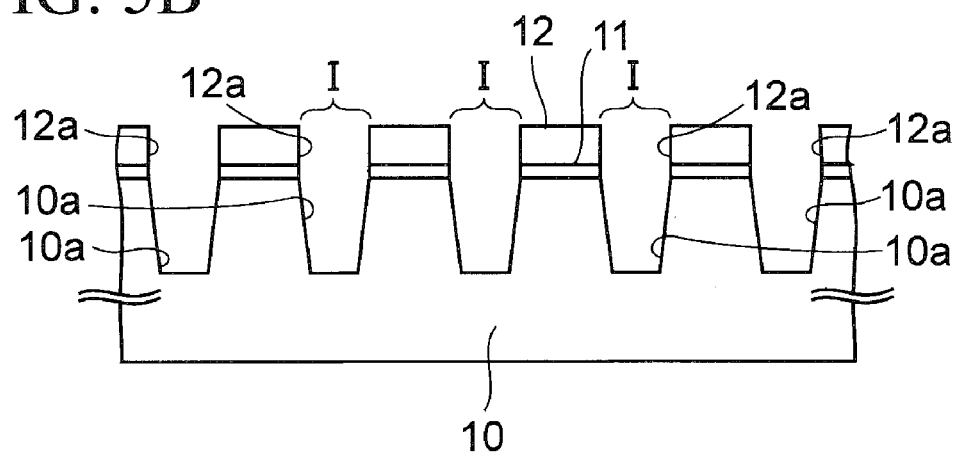

Next, as shown in FIG. 5B, the silicon nitride film 12 is patterned to form openings 12a. Then, anisotropic etching is carried out on the silicon oxide film 11 and the silicon substrate 10 through the openings 12a so as to form device isolation grooves 10a in partial regions I of the silicon substrate 10. A depth of the device isolation grooves 10a is approximately 400 nm from the surface of the silicon nitride film 12.

Figure 5C:
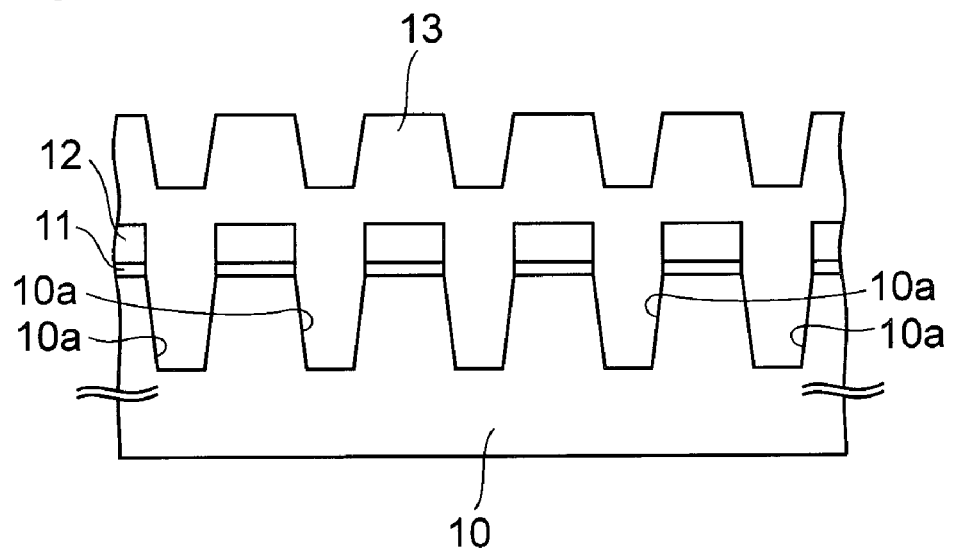

Subsequently, to recover damages received in inner surfaces of the device isolation grooves 10a due to the etching, a thermally-oxidized film is formed on the inner surfaces of the grooves 10a. Thereafter, as shown in FIG. 5C, a silicon oxide film as a device isolation insulating film 13 is formed in the device isolation grooves 10a and on the silicon nitride film 12 by the high-density plasma CVD method.

A thickness of the device isolation insulating film 13 is set to such that the device isolation grooves 10a are completely embedded with the film 13, for example, to 450 nm. In addition, as shown in the figure, unevenness reflecting an underlying layer are formed on an upper surface of the device isolation insulating film 13 that is formed by the high-density plasma CVD method.

Figure 5D:
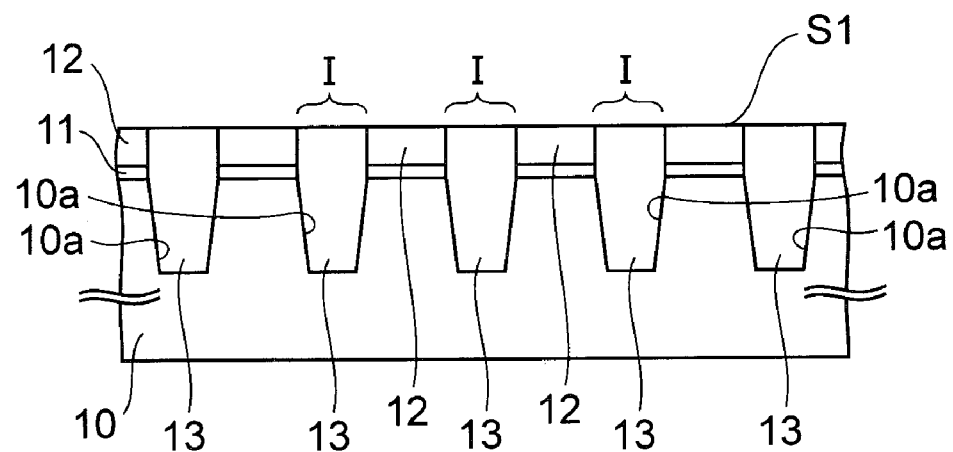

Next, as shown in FIG. 5D, while using the silicon nitride film 12 as a polishing stopper film, the device isolation insulating film 13, which is to be polished, is polished in the polishing unit 100a of FIG. 1. Thereby, the excessive device isolation insulating film 13 on the silicon nitride film 12 is polished and removed, and the device isolation insulating film 13 is left only in the device isolation grooves 10a.

For example, the following conditions are employed as conditions for the polishing.

Pressure of polishing head 104 . . . 280 g weight/cm$^2$

Rotating speed of polishing head 104 . . . 98 rpm

Rotating speed of platen 102 . . . 110 rpm

Amount of supplied slurry . . . 0.2 litter per minute

Note that SS25, manufactured by Cabot Corporation, may be used as a slurry by diluting it with pure water by a volume ratio of 1 to 1. Then, IC1010, manufactured by Rodel Nitta Company, may be used as the polishing pad 101.

By such polishing, over the silicon substrate 10, there is formed a polished surface S1 that is constructed from upper surfaces of the silicon nitride film 12 and the device isolation insulating film 13 that is made of silicon oxide formed in the partial regions I.

Next, the polished surface S1 is cleaned in the cleaning unit 100b described in FIG. 1.

In the present example, the cleaning is carried out by the following two steps.

In the first cleaning step, in the ammonia cleaning tank 120, while the cleaning brushes 123 are applied to the silicon substrate 10, ammonia water with a concentration of approximately 0.1% is discharged from the ammonia nozzles 120a to the silicon substrate 10. Thereafter, pure water is discharged from the pure water nozzles 120b to the silicon substrate 10 so as to rinse the surface of the silicon substrate 10.

Subsequently, in the second cleaning step, in the hydrofluoric acid cleaning tank 121, hydrofluoric acid with a concentration of approximately 0.5% is discharged to the silicon substrate 10 to remove metal impurities adhered onto the surface of the silicon substrate 10. After that, the surface of the silicon substrate 10 is rinsed by pure water discharged from the pure water nozzles 121b.

Note that in this second step, the brushes 123 may be applied to the silicon substrate 10 either during discharge of the hydrofluoric acid or during rinse by the of pure water.

Thereafter, in the dryer tank 122, the silicon substrate 10 is dried by either IPA drying or spin drying.

Incidentally, megasonic processing may be carried out on the silicon substrate 10 either before the silicon substrate 10 is conveyed to the ammonia tank 120 or after the silicon substrate 10 is dried in the dryer tank 122.

By the steps described above, the main processes of the method for manufacturing a semiconductor device according to the present example are finished.

Figure 6:
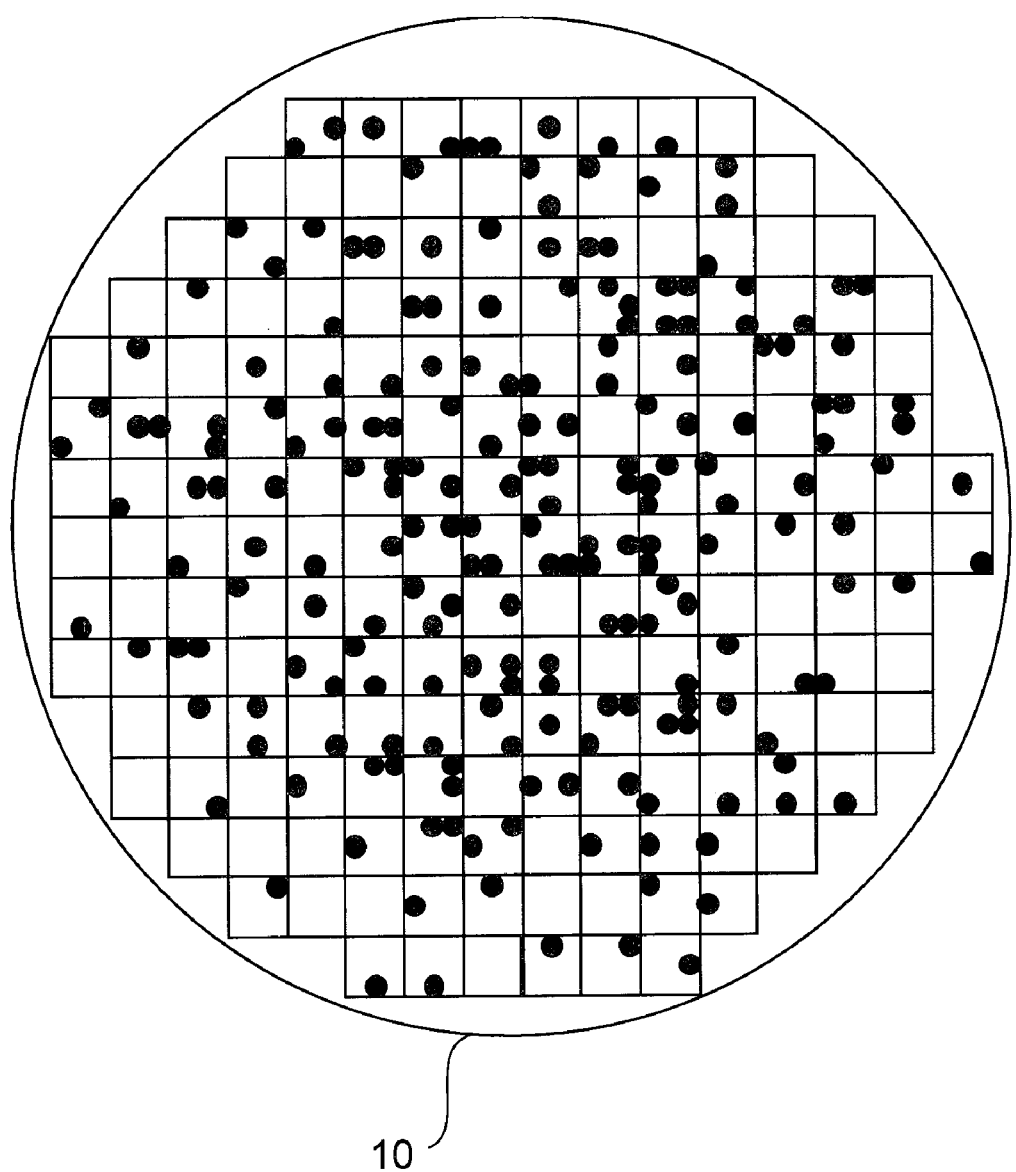
FIG. 6 is a wafer map showing in-plane distribution of defects on a semiconductor substrate.

FIG. 6 is a wafer map showing in-plane distribution of defects in the case where the silicon wafer with the diameter of 300 mm was used as the substrate 10 and the above-described processes were carried out on the silicon wafer. For the defect measurement, a defect inspection device 2800 manufactured by KLA-Tencor Corporation was used.

As shown in FIG. 6, it became apparent that, when the silicon wafer with the large diameter of 300 mm was used, a number of foreign materials were adhered onto the silicon wafer even though cleaning was carried out after the CMP.

Figure 7:
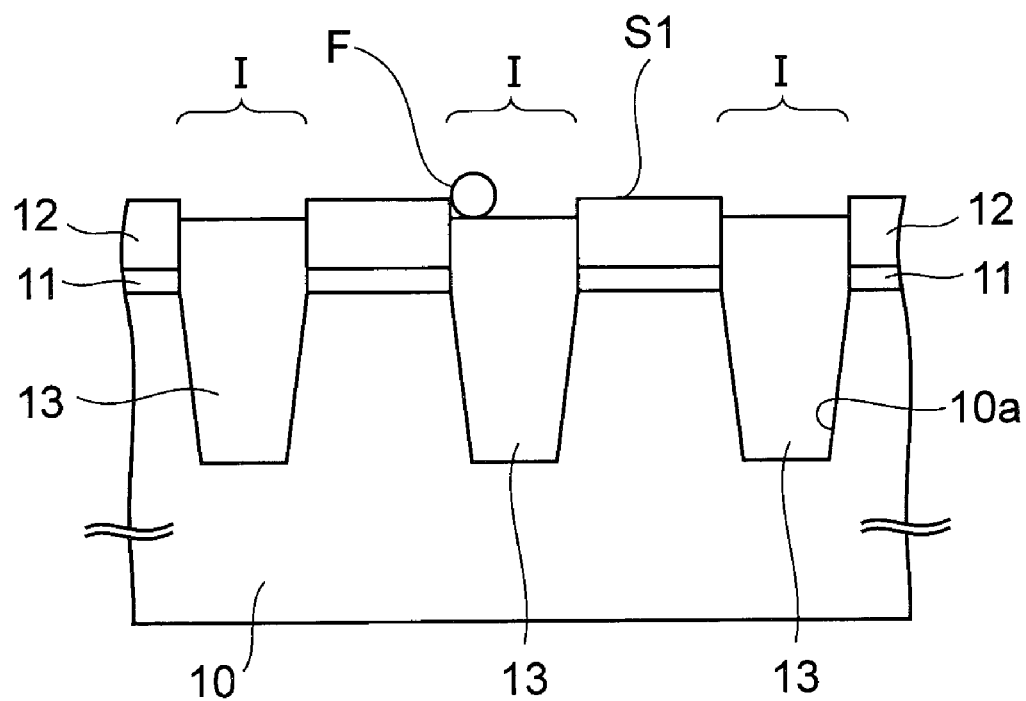
FIG. 7 is a cross-sectional view for illustrating a cause of a foreign material residual on a polished surface.

The possible reason why the foreign materials remain on the silicon wafer is because the polished surface S1 formed by CMP is not strictly flat. Specifically, as shown in FIG. 7, the upper surface of the device isolation insulating film 13, which is to be polished, becomes lower than the upper surface of the silicon nitride film 12 that serves as the polishing stopper film. Accordingly, stepped portions are formed on the polished surface S1 in boundaries between the partial regions I and other regions adjacent to the partial regions I.

If such stepped portions are present, a foreign material F, made from an abrasive grain and the like in a slurry, is easily stuck to the stepped portion, and thus the foreign material F becomes difficult to be removed by the cleaning brushes 123. In addition, it is also possible that the foreign material removed by the brushes 123 is adhered again to the wafer by being stuck to the stepped portion.

Next, another example of a method for manufacturing a semiconductor device using the semiconductor manufacturing equipment 100 will be described.

FIGS. 8A to 8F are cross-sectional views showing processes of manufacturing a semiconductor device.

Figure 8A:
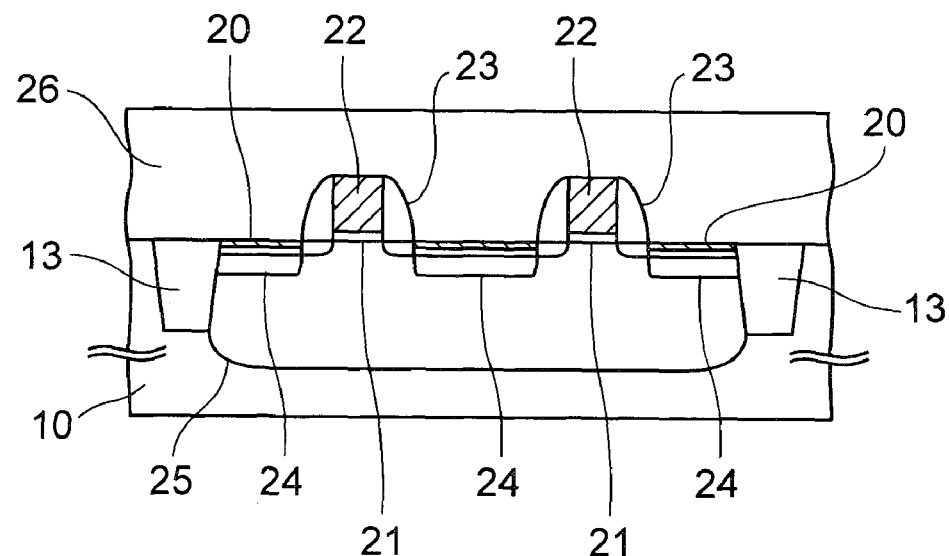
FIGS. 8A to 8F are cross-sectional views for illustrating another example of a method for manufacturing a semiconductor device using the semiconductor manufacturing equipment of FIG. 1.

To manufacture this semiconductor device, the above-described processes of FIGS. 5A to 5D are carried out, and then the process shown in FIG. 8A is carried out.

In this process, a p-well 25 is firstly formed in a predetermined depth of a silicon substrate 10.

Thereafter, a surface of the silicon substrate 10 is thermally oxidized to form a thermally-oxidized film that serves as a gate insulating film 21. Furthermore, gate electrodes 22 made of polysilicon are formed on the gate insulating film 21.

Then, an insulating film, such as a silicon oxide film, is formed on an entire upper surface of the silicon substrate 10 by the CVD method. Thereafter, the insulating film is etched back to be left as insulating sidewalls 23 on both sides of the gate electrodes 22.

After that, by using the gate electrodes 22 and the insulating sidewalls 23 as a mask, n-type impurities are ion-implanted into the silicon substrate 10 to form n-type source/drain regions 24. Then, a metal silicide layer 20, such as a titanium silicide layer, is formed on the source/drain regions 24.

Furthermore, a silicon oxide film is formed with a thickness of approximately 600 nm on the entire upper surface of the silicon substrate 10 by the high-density plasma CVD method. This silicon oxide film is used as a first interlayer insulating film 26.

Thereafter, the upper surface of the first interlayer insulating film 26 is polished and planarized by the CMP method, so that the thickness of the first interlayer insulating film 26 becomes approximately 300 mm.

Figure 8B:
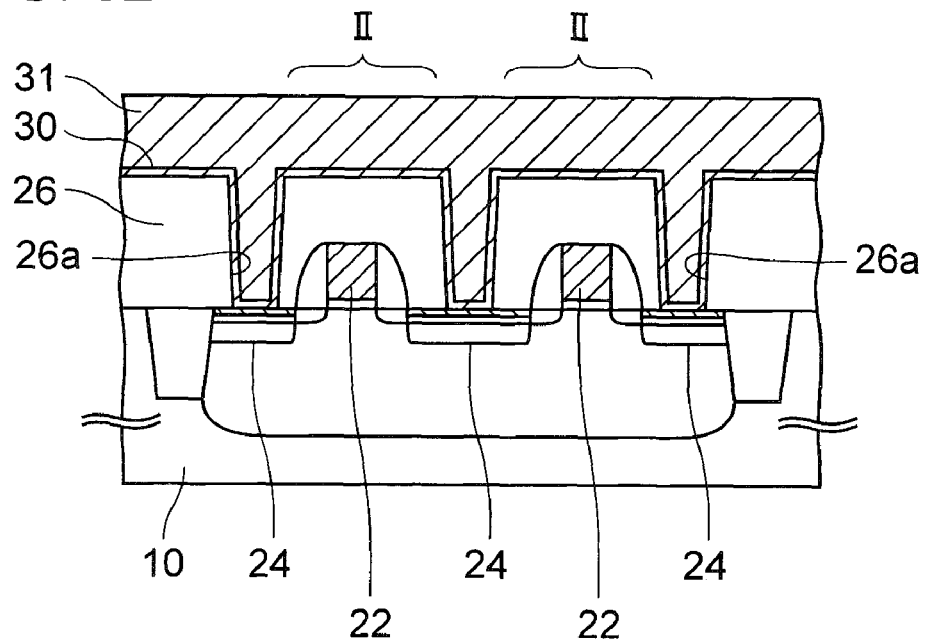

Next, as shown in FIG. 8B, the first interlayer insulating film 26 made of silicon oxide is patterned to form contact holes 26a in other regions adjacent to partial regions II.

Subsequently, on inner surfaces of the contact holes 26a and the upper surface of the first interlayer insulating film 26, a titanium film and a titanium nitride film, each of which has a thickness of approximately 10 nm, are formed in this order by the sputtering method. These films are used as a glue film 30.

Thereafter, a tungsten film 31 is formed on the glue film 30 by the CVD method. The contact holes 26a are completely embedded by the tungsten film 31. The thickness of the tungsten film 31 is approximately 300 mm.

Figure 8C:
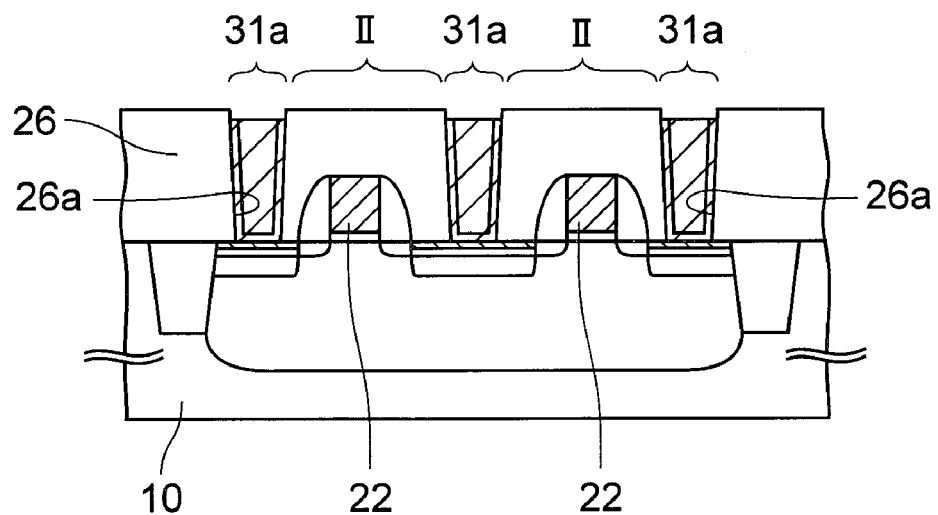

Next, as shown in FIG. 8C, in the polishing unit 100a described in FIG. 1, the excessive tungsten film 31 and glue film 30 on the first interlayer insulating film 26 are polished and removed by the CMP method. Thereby, the tungsten film 31 and glue film 30 are left as conductive plugs 31a only in the contact holes 26a, and the first interlayer insulating film 26 made of silicon oxide is exposed on the surface in the partial regions II.

Such a slurry is used in this CMP method that a polishing rate of the tungsten film 31, which is a film to be polished, becomes faster than that of the first interlayer insulating film 26 that is made of silicon oxide and underlying under the tungsten film 31. For example, Semi-Sperse W2000, manufactured by Cabot Corporation, is used as the slurry.

Figure 9:
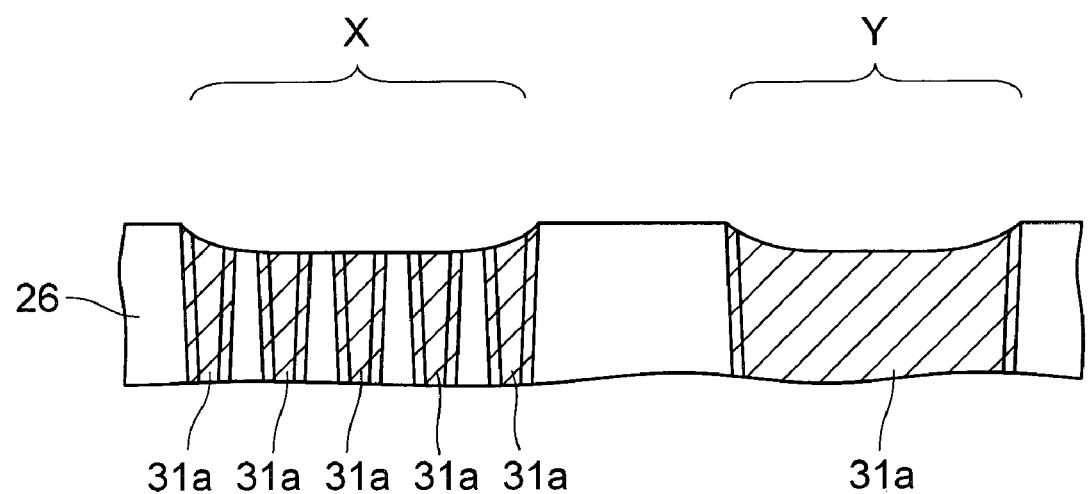
FIG. 9 is a cross-sectional view for illustrating erosion and dishing to be caused by CMP.

However, when such a slurry is used, as shown in FIG. 9, there is caused a phenomenon called "erosion" that each of the upper surfaces of the conductive plugs 31a and the first interlayer insulating film 26 subducts in region X where the conductive plugs 31a are densely arranged.

In addition, in region Y where the diameter of the conductive plug 31a is large, there is caused a phenomenon called "dishing" that the upper surface of the conductive plug 31a is recessed.

Figure 8D:
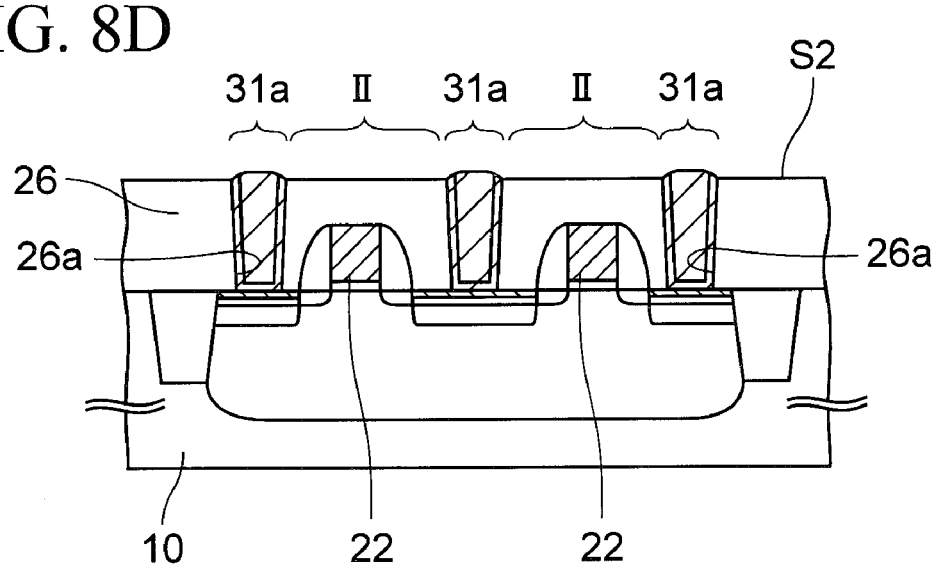

In order to avoid these phenomena, as shown in FIG. 8D, such a slurry that a polishing rate of the first interlayer insulating film 26 becomes faster than that of the tungsten film 31, for example Semi-Sperse SS25 manufactured by Cabot Corporation, is used to polish again the conductive plugs 31a and the first interlayer insulating film 26 by the CMP method. Thereby, the height of the upper surface of the first interlayer insulating film 26 is lowered by approximately 50 nm.

By performing such two-steps CMP, a polished surface S2 constructed from the upper surfaces of the first interlayer insulating film 26 and the conductive plugs 31a is formed. In the polished surface S2, since the upper surface of the first interlayer insulating film 26 is lowered in the CMP process of FIG. 8D, stepped portions are formed in boundaries between the partial regions II and other regions adjacent to the partial regions II.

Subsequently, the silicon substrate 10 is conveyed to the cleaning unit 100b of FIG. 1 to clean the slurry and the like adhered to the silicon substrate 10.

This cleaning is carried out in two steps as follows.

In the first step, in the ammonia cleaning tank 120, while the cleaning brushes 123 are applied to the silicon substrate 10, cleaning is carried out by discharging ammonia water with a concentration of approximately 0.1% from the ammonia nozzles 120a.

In the second step, the silicon substrate 10 is conveyed to the hydrofluoric acid cleaning tank 120, and hydrofluoric acid with a concentration of approximately 0.5% is discharged from the hydrofluoric acid nozzles 121a to the silicon substrate 10.

Then, after the supply of hydrofluoric acid is stopped, the silicon substrate 10 is rinsed. This rinse is performed by discharging pure water from the pure water nozzles 121b, while the cleaning brushes 123 are applied to the silicon substrate 10.

By the steps described above, the cleaning processes after CMP are completed.

Figure 8E:
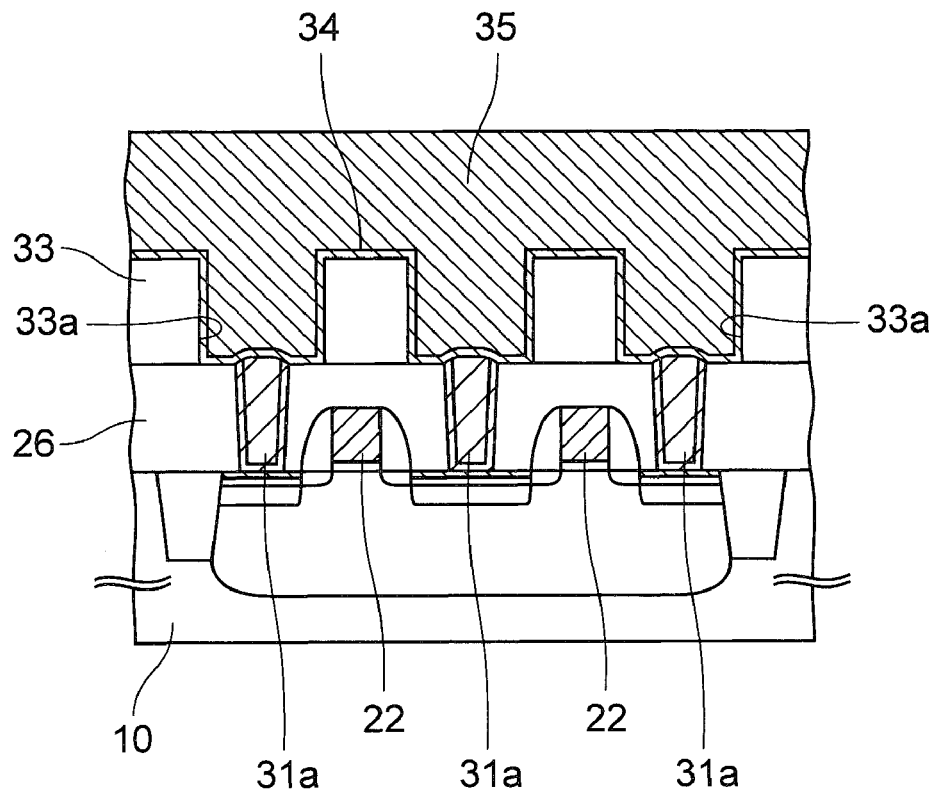

Next, processes for obtaining a cross-sectional structure shown in FIG. 8E will be described.

Firstly, a silicon oxide film as a second interlayer insulating film 33 is formed on each of the upper surfaces of the conductive plugs 31a and the first interlayer insulating film 26 by the CVD method.

Subsequently, the second interlayer insulating film 33 is patterned to form wiring grooves 33a on the conductive plugs 31a.

Furthermore, a tantalum nitride film is formed on inner surfaces of the wiring grooves 33a and the upper surface of the second interlayer insulating film 33 by the sputtering method. This tantalum nitride film is used as a barrier metal film 34.

Thereafter, a copper film 35 is formed on the barrier metal film 24 by electrolytic plating to completely fill the wiring grooves 33a with the copper film 35.

Figure 8F:
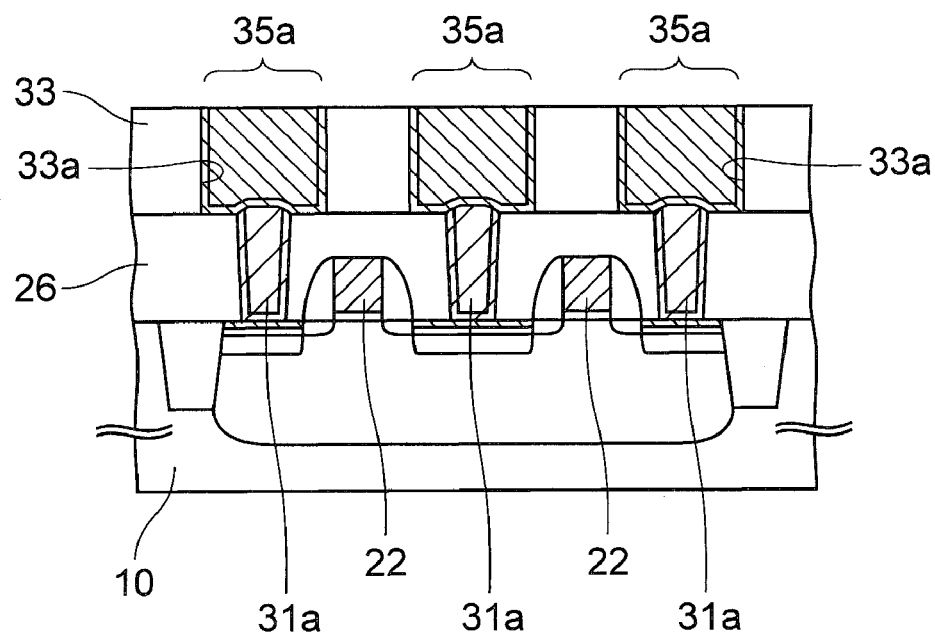

Next, as shown in FIG. 8F, the excessive copper film 35 and barrier metal film 34 on the second interlayer insulating film 33 are polished by the CMP method to leave these films 35 and 34 only in the wiring grooves 33a as wirings 35a.

Such a method for forming the wirings 35a is referred to as the damascene method.

By the steps so far, the main processes of the method for manufacturing a semiconductor device according to the present example are completed.

Figure 10:
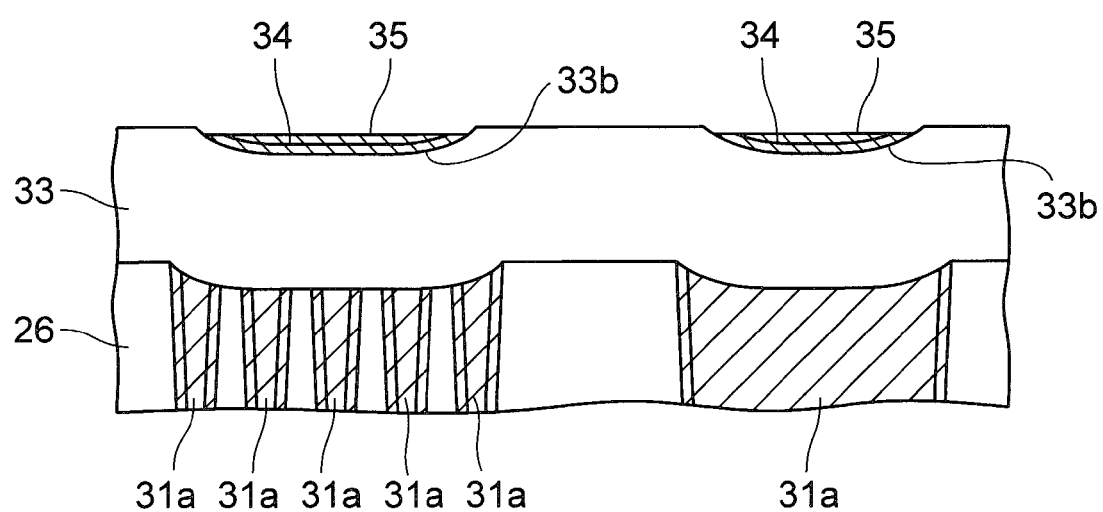
FIG. 10 is a cross-sectional view for illustrating that a polishing residue of a copper film is caused by erosion and dishing.

In the present example, CMP is carried out in the two steps by using different slurries in the processes of FIGS. 8C and 8D so as to avoid recessed portions like "dishing" and "erosion" in the conductive plugs 31a and the first interlayer insulating film 26. If such recessed portions were to be formed, as shown in FIG. 10, recessed portions 33b would also formed in the second interlayer insulating film 33, and the copper film 35 would remain in the recessed portions 33b in the CMP process of FIG. 8F. However, in the present example, such polishing residual of copper film can be prevented from being caused.

Figure 11:
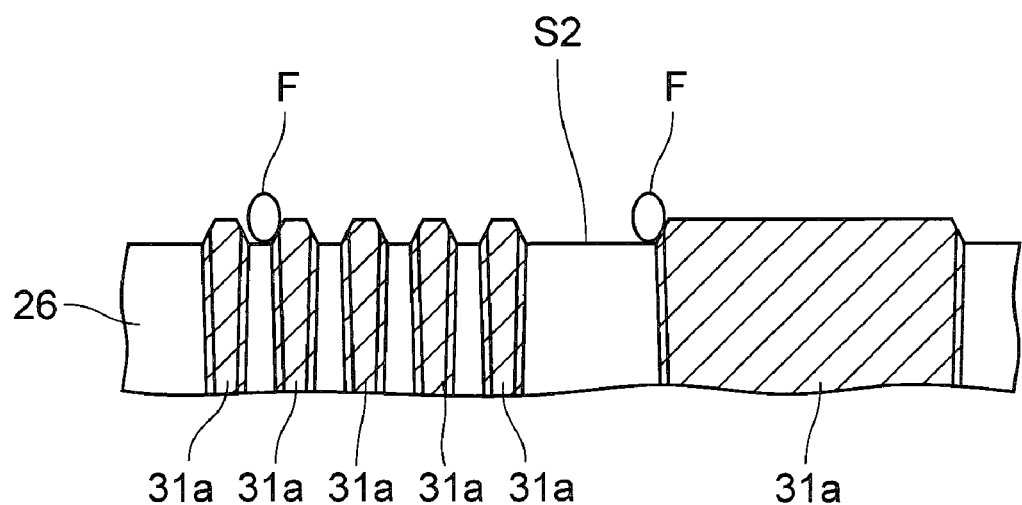
FIG. 11 is a cross-sectional view for illustrating that conductive plugs protrude from an interlayer insulating film by two-steps CMP.

Incidentally, in such two-steps CMP, a slurry by which a polishing rate to the first interlayer insulating film 26 is faster than that to the conductive plugs 31a is used in the second step (FIG. 8D). Accordingly, as shown in FIG. 11, the conductive plugs 31a protrude from the upper surface of the first interlayer insulating film 26, and stepped portions with a height in a range from 10 to 30 nm are formed in the polished surface S2.

If such stepped portions are present, similar to the first example, the foreign material F, such as an abrasive grain in a slurry, is stuck to the stepped portions, and thus the foreign material F becomes difficult to be removed by the cleaning carried out in the cleaning unit 100b after CMP. Consequently, when the polished surface S2 is inspected by a defect inspection device 2800 series manufactured by KLA-Tencor Corporation, a wafer map similar to that shown in FIG. 6 is obtained.

In the above-described method for manufacturing a semiconductor device, at the time when the polished surfaces S1 and S2 are cleaned, they are cleaned firstly by use of ammonia water and then by use of hydrofluoric acid in the cleaning unit 100b.

This order of cleaning has been used as a long-established method in the art of manufacturing semiconductor devices during the course of developing CMP techniques. This is based on the following knowledge.

That is, an interaction between the foreign materials in a cleaning fluid and a silicon substrate is determined by a $\zeta$ potential of the foreign materials. Since the silicon substrate 10 and the foreign materials act repulsively in the alkaline ammonia water, the foreign materials become easy to be removed from the substrate. Accordingly, most of the foreign materials are removed by the first cleaning in the ammonia water as described above, and metal impurities, which are still left even after the first cleaning, are removed by the next cleaning by use of hydrofluoric acid. This is a commonly accepted theory that can maximize the cleaning effects.

However, according to the investigations conducted by the inventors of the present application, it became apparent that such a commonly-accepted theory was not valid any longer for the silicon substrate 10 with the wafer diameter of 300 mm, and the significant number of foreign materials remained on the silicon substrate 10 when the cleaning was carried out in the above-described cleaning order.

FIGS. 12 to 17 are graphs obtained by this investigation. In each of the graphs, in accordance with the above-described commonly-accepted theory, cleaning was firstly carried out by use of ammonia water with a concentration of 0.5% and, then by use of hydrofluoric acid with a concentration of 0.5%. The first cleaning by use of ammonia water was carried out while applying the brushes 123 to the silicon substrate 10.

In addition, in this investigation, the number of foreign materials with the size of 0.15 μm was measured by using a defect inspection device 2800 manufactured by KLA-Tencor Corporation.

Figure 12:
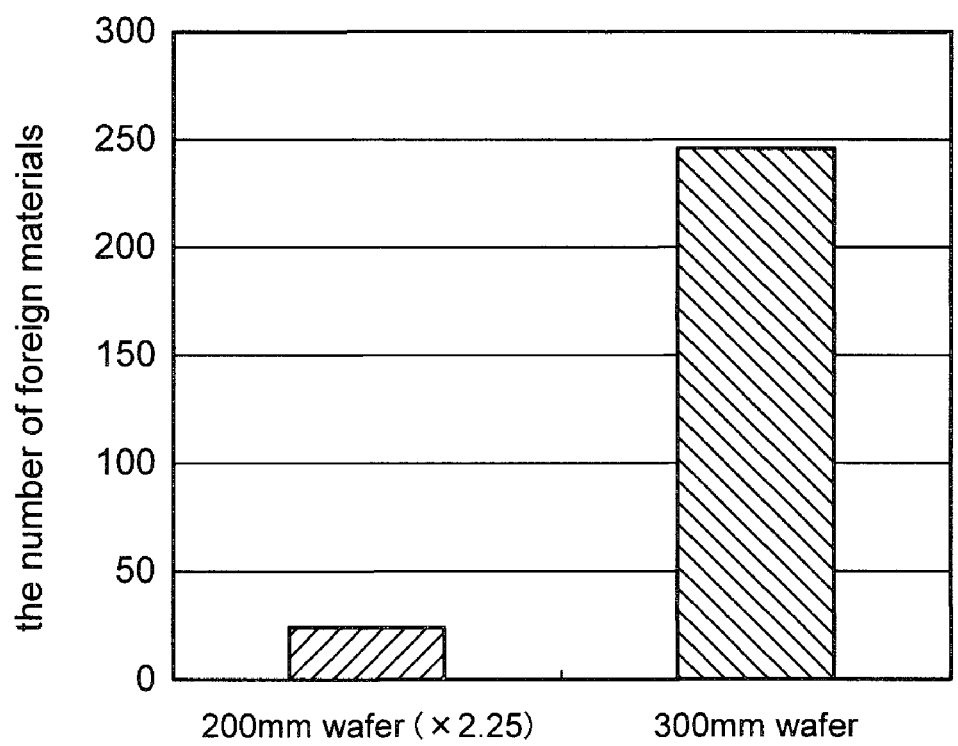
FIG. 12 is a graph obtained by investigating the number of foreign materials on a silicon oxide film formed on a silicon substrate on which no pattern is formed.

FIG. 12 is a graph obtained by comparing the numbers of foreign materials on a silicon substrate 10 with the wafer diameter of 200 mm and a silicon substrate 10 with the wafer diameter of 300 mm. In this investigation, a silicon oxide film is formed by the plasma CVD method on each of the silicon substrates on which no pattern is formed. Thereafter, the silicon oxide film is polished by the CMP method and then is cleaned in the above-described cleaning order. Note that, to fairly make the comparison, the number of foreign materials on the 200 mm wafer is multiplied by 2.25, which corresponds to an area ratio of the 200 mm wafer to the 300 mm wafer. This is also the case for the investigation results of FIGS. 13 to 23 to be described later.

In addition, a slurry used in the CMP method was Semi-Sperse SS25 manufactured by Cabot Corporation, which is mainly formed of silica, KOH, and water.

As shown in FIG. 12, in the cleaning carried out for the silicon oxide film on which no pattern is formed, the number of foreign materials remained on the 300 mm wafer is larger than that on the 200 mm wafer.

Figure 13:
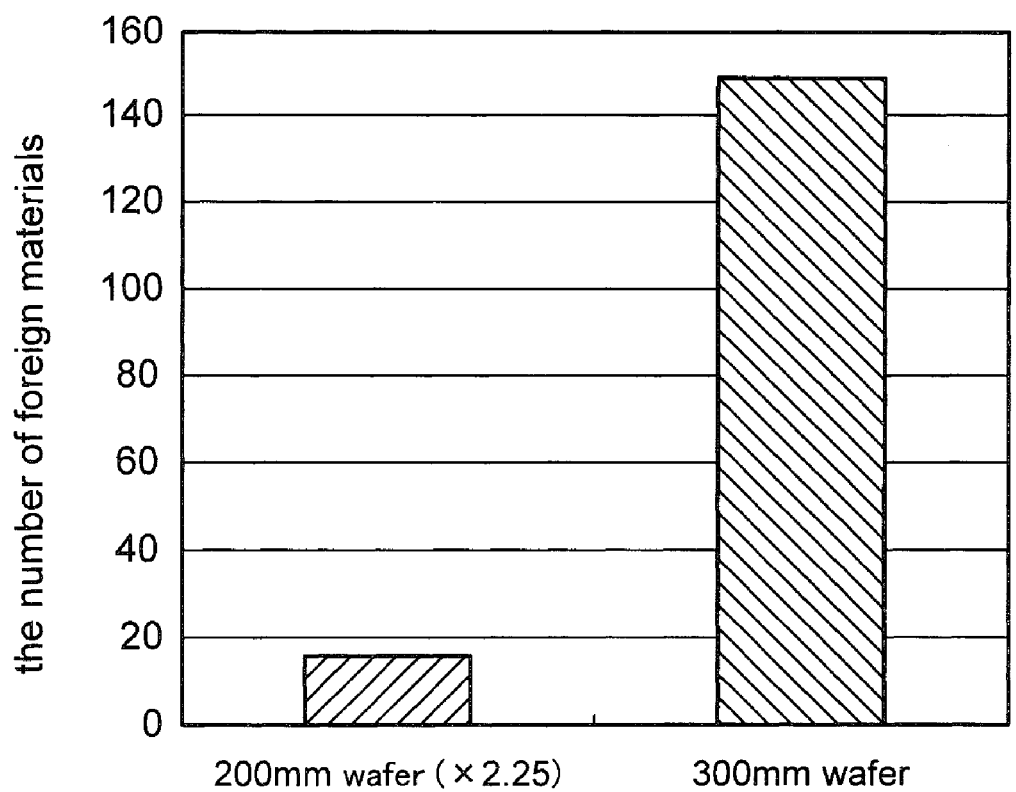
FIG. 13 is a graph obtained by investigating the number of foreign materials on the silicon oxide film by using a slurry for the silicon oxide film, which is different from that used in the case of FIG. 12.

FIG. 13 is a graph obtained by, instead of the Semi-Sperse SS25, using a slurry STI2100 manufactured by DuPont Air Products NanoMaterials L.L.C., which is mainly formed of a cerium oxide abrasive grain, a surface active agent, and water, and by carrying out the same investigation as that of FIG. 2.

As shown in FIG. 13, even if the slurry was changed, the larger number of foreign materials still remains on the 300 mm wafer.

Figure 14:
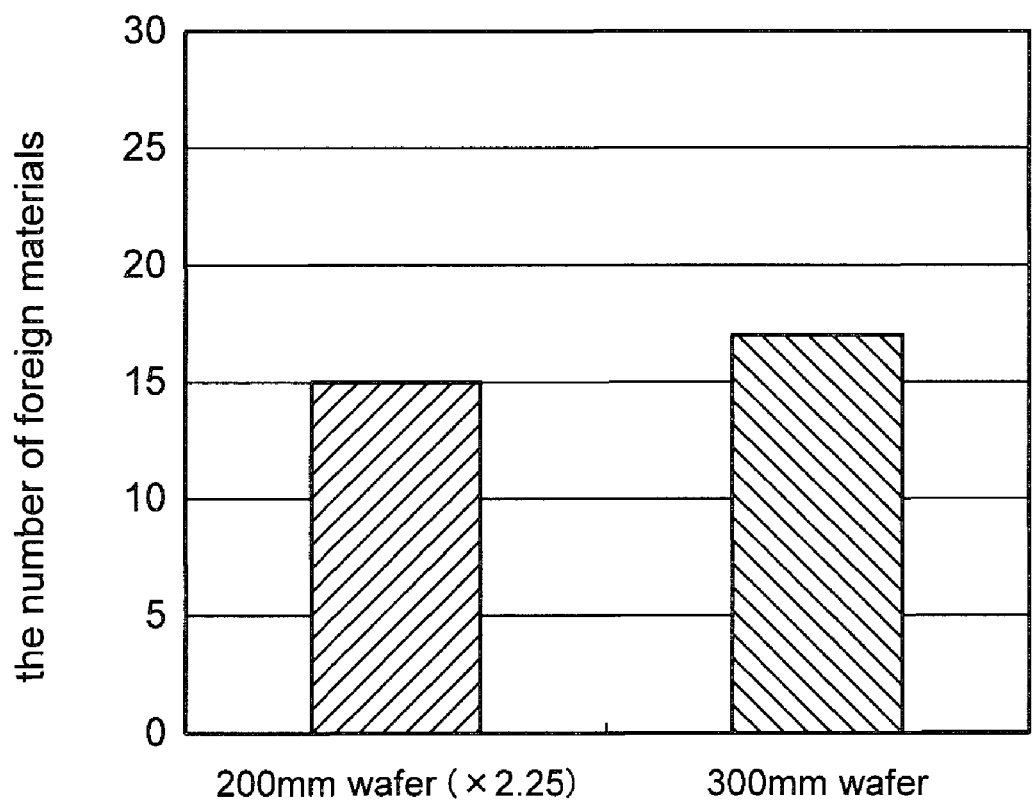
FIG. 14 is a graph obtained by investigating the number of foreign materials on a tungsten film formed on a silicon substrate on which no pattern is formed.

In the investigation of FIG. 14, such a sample was used that a silicon oxide film formed by the plasma CVD method, a titanium nitride film formed by the sputtering method, and a tungsten film are formed in this order on a silicon substrate on which no pattern is formed. Then, polishing by CMP was carried out on the uppermost tungsten film of the sample by using slurry Semi-Sperse SSW2000 manufactured by Cabot Corporation, which is mainly formed of silica, $H_2O_2$, and water. Thereafter, as described above, cleaning by use of ammonia water and cleaning by use of hydrofluoric acid were carried out in this order.

As shown in FIG. 14, in the cleaning after CMP on the tungsten film, the foreign materials are removed regardless of the wafer diameters.

As can be understood from the investigation results of FIGS. 12 to 14, except the cleaning carried out on the tungsten film (FIG. 14), in the cleaning carried out on a film without pattern formed on a silicon substrate with the wafer diameter of 300 mm, foreign materials cannot be sufficiently removed by the cleaning carried out in the order of firstly with ammonia water and then with hydrofluoric acid, which has been a commonly-accepted theory.

Figure 15:
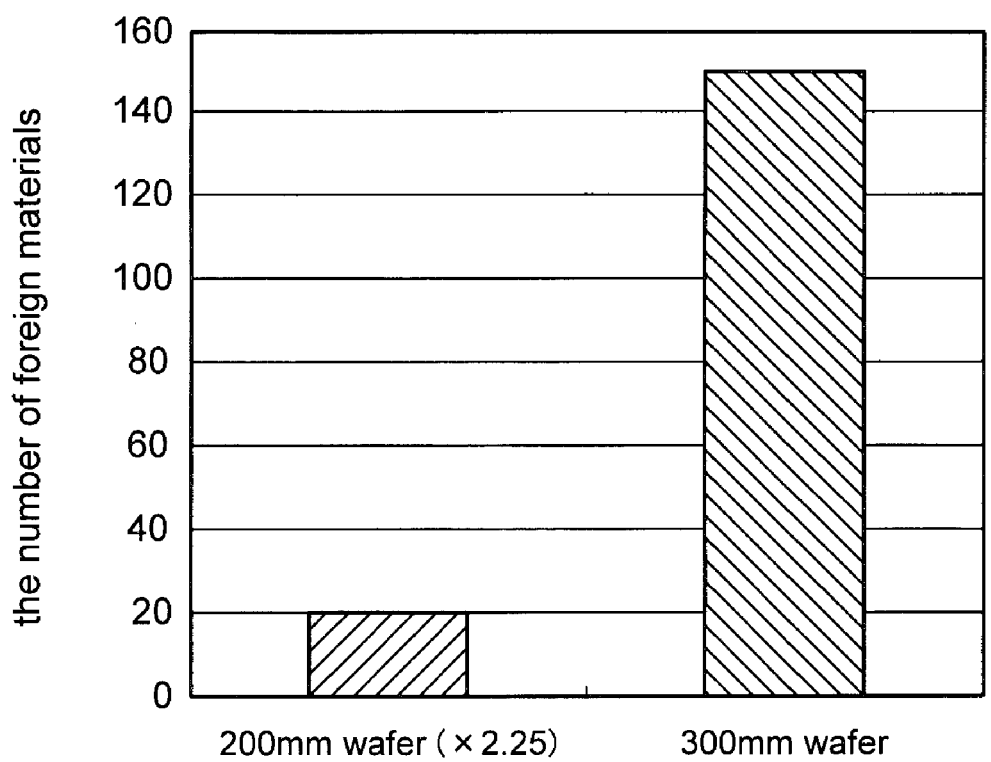
FIG. 15 is a graph obtained by investigating the number of foreign materials on a silicon substrate on which a CMP process to leave an device isolation insulating film in a device isolation groove for STI is carried out.
Figure 16:
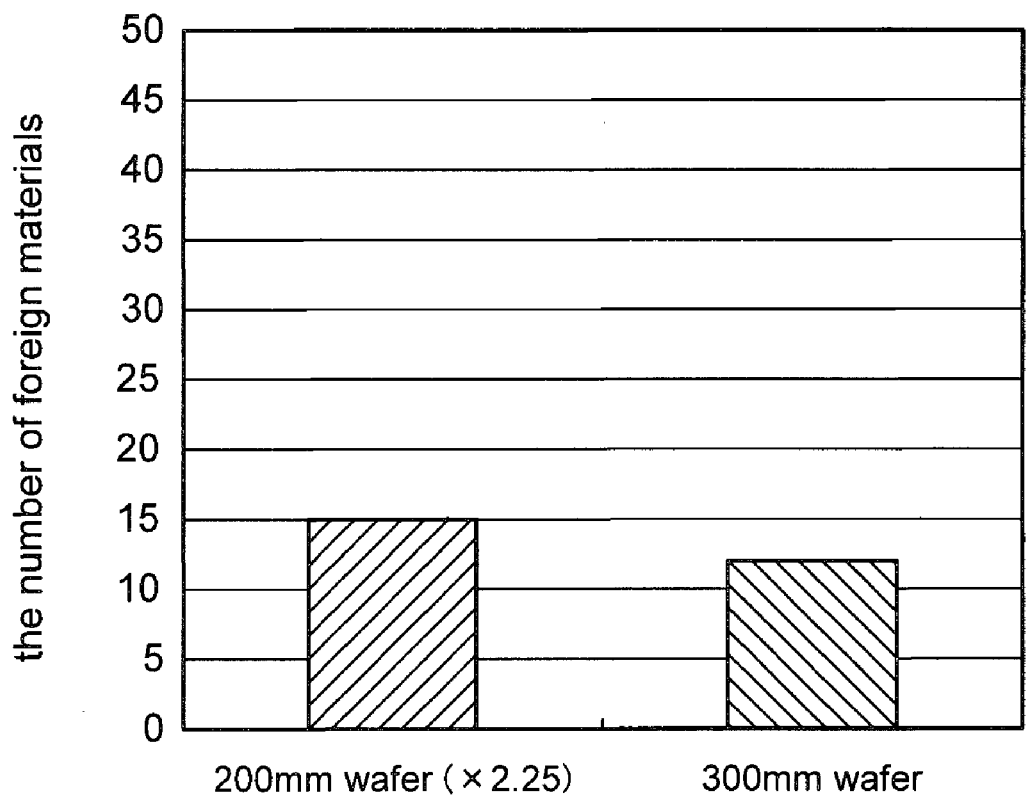
FIG. 16 is a graph obtained by investigating the number of foreign materials on a silicon substrate on which tungsten CMP to form conductive plugs is carried out.

FIGS. 15 and 16 are graphs showing the investigation results obtained by carrying out CMP on a film formed on an underlying patterned film. After this CMP, similar to the cases of FIGS. 12 to 14, cleaning by use of ammonia water together with brushes 123 was firstly carried out, and then cleaning by use of hydrofluoric acid was carried out.

Among these graphs, the investigation result of FIG. 15 shows the result of the CMP process carried out to leave the device isolation insulating film in the device isolation grooves for STI. The sample obtained by following the processes same as those of FIGS. 5A to 5D was used in this investigation.

As shown in FIG. 15, even in the case where there is a pattern such as a device isolation groove, the number of foreign materials adhered onto the silicon substrate with the wafer diameter of 300 mm was larger than that of the silicon substrate with the wafer diameter of 200 mm. As described in FIG. 7, it is considered that the foreign materials are stuck to the stepped portions with a height in a range from a several nm to 10 nm formed in the boundaries of the silicon nitride film 12 and the device isolation insulating film 13.

In contrast, the investigation result of FIG. 16 shows the result of tungsten CMP for forming the conductive plugs.

In this investigation, CMP of the first step described in FIG. 8C, that is, the CMP using the slurry by which a polishing rate of the tungsten film 31 becomes faster than that of the first interlayer insulating film 26 was only carried out. CMP of the second step described in FIG. 8D was not carried out. As for the slurry, Semi-Sperse W2000 manufactured by Cabot Corporation was used. As described above, when only the CMP of the first step was carried out, the upper surfaces of the conductive plugs are easily lowered than the upper surface of the first interlayer insulating film 26, so that dishing and erosion are easily caused.

As shown in FIG. 16, in the above-described case, the foreign materials are removed from both of the silicon substrates with the diameters of 200 mm and 300 mm.

Figure 17:
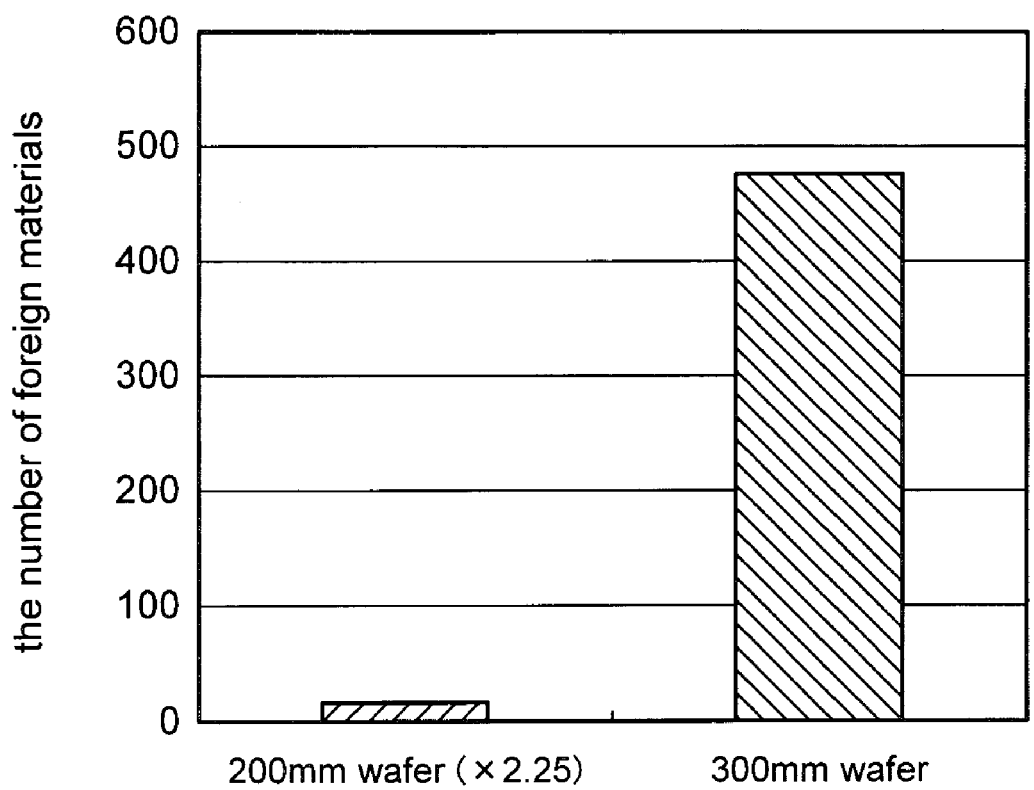
FIG. 17 is a graph obtained by investigating the number of foreign materials on a silicon substrate in the case where two-steps CMP to avoid dishing and erosion is carried out.

The investigation result of FIG. 17 was obtained in the case where the conductive plugs were formed by carrying out the two-steps CMP of FIGS. 8C and 8D, in order to avoid the dishing and erosion.

In the CMP of the first step (FIG. 8C), similar to the case of FIG. 16, Semi-Sperse W2000 manufactured by Cabot Corporation was used as a slurry. In the CMP of the following step (FIG. 8D), a slurry Semi-Sperse SS25 manufactured by Cabot Corporation, by which a polishing rate of the first interlayer insulating film 26 becomes faster than that of the tungsten film 31, was used, and the thickness of the first interlayer insulating film 26 was reduced by approximately 50 nm.

By such a two-steps CMP, there is obtained a structure that the conductive plug 31a slightly protrudes from the upper surface of the first interlayer insulating film 26, as described in FIG. 11.

As shown in FIG. 17, even when the cleaning is carried out on a film with such a structure in the above-described cleaning order, the considerably large number of foreign materials remains on the silicon substrate with the wafer diameter of 300 mm, when compared with the case of the silicon substrate with the wafer diameter of 200 mm.

This is possibly because the upper surfaces of the conductive plugs protruding from the first interlayer insulating film causes the following situations. That is, the foreign materials are stuck to the conductive plugs and thus become difficult to be removed by the brushes 123, or the foreign materials removed by the brushes 123 are stuck again to the conductive plugs.

From the above-described results, it became apparent that, in the cleaning carried out in the order of firstly with ammonia water and then with hydrofluoric acid, cleaning capability after CMP was decreased by simply enlarging the wafer diameter to 300 mm (FIGS. 12 to 14), and that the cleaning capability was also decreased depending on the pattern structure (FIGS. 15 to 17).

Accordingly, the inventors of the present application investigated in which cleanings the foreign materials were not removed, the cleaning by use of ammonia water or that by use of hydrofluoric acid.

In this investigation, a silicon oxide film was formed by the plasma CVD method on a silicon substrate on which no pattern is formed. Thereafter, the silicon oxide film was polished by a slurry (Semi-Sperse SS25 manufactured by Cabot Corporation), which is mainly formed of silica, KOH, and water. Then, two cleaning methods of (A) using only hydrofluoric acid with a concentration of approximately 0.5% together with brushes 123 and (B) using only ammonia water with a concentration of approximately 0.5% together with brushes 123 were carried out on the silicon oxide film after the polishing. Then, the numbers of foreign materials remained on the silicon oxide film were measured.

Figure 18:
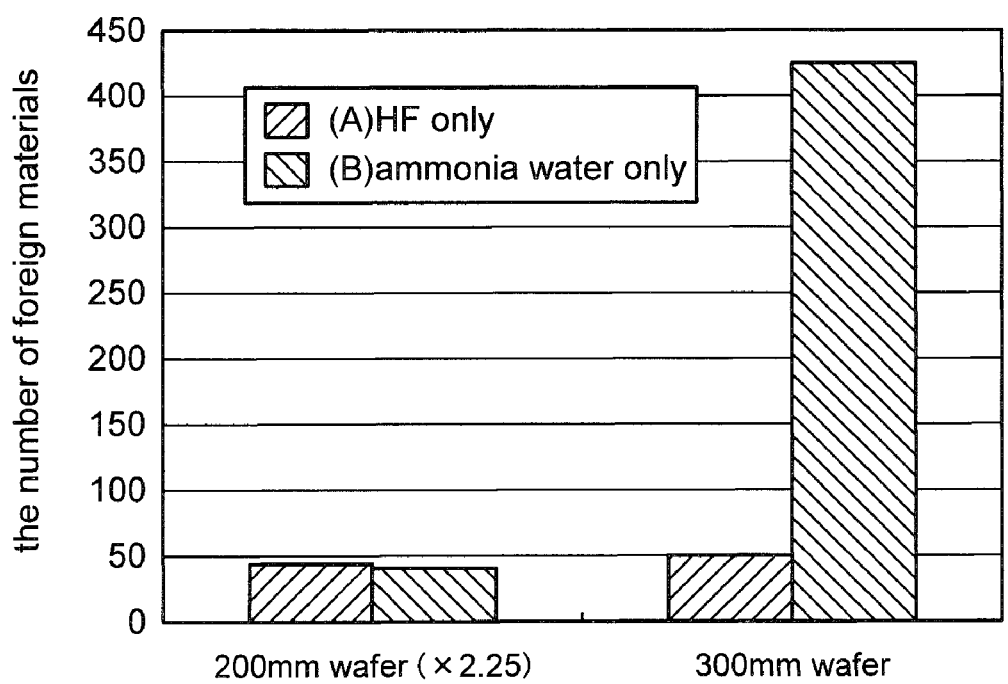
FIG. 18 is a graph obtained by investigating the numbers of foreign materials on a silicon oxide film in each cases where cleaning is carried out only by use of hydrofluoric acid and where cleaning is carried out only by use of ammonia water.

The investigation results are shown in FIG. 18.

As shown in FIG. 18, in the case where the wafer diameter is 200 mm, foreign materials were removed irrespective of whether the cleaning was performed only with ammonia water or with hydrofluoric acid.

In contrast, it became apparent that in the case where the wafer diameter was 300 mm, foreign materials were removed by cleaning with hydrofluoric acid, whereas many foreign materials remained by cleaning with ammonia water.

From this result, it is understood that the cleaning by use of ammonia water together with brushes has insufficient cleaning capability to the silicon substrate with the wafer diameter of 300 mm. The inventors of the present application consider the reasons for this as follows.

In the semiconductor manufacturing equipment 100 for the wafer diameter of 200 mm and the semiconductor manufacturing equipment 100 for the wafer diameter of 300 mm, the diameters of cleaning brushes 123 attached to the equipments are the same, and only lengths of the cleaning brushes 123 change in accordance with the wafer diameters.

On the other hand, in the silicon substrate with the wafer diameter of 200 mm and the silicon substrate with the wafer diameter of 300 mm, the wafer diameter of the latter is 1.5 times larger than that of the former, and thus the area of the latter is 2.25 times larger than that of the former. Accordingly, after polishing, the number of foreign materials left on the silicon substrate with the wafer diameter of 300 mm also becomes 2.25 times larger than that left on the silicon substrate with the wafer diameter of 200 mm. As described above, the diameters of the cleaning brushes 123 for 200 mm and 300 mm wafers are the same. Also, there is no large difference between the contacting areas of the brushes 123 with the silicon substrates for 200 mm and with 300 mm wafers. Thus, it is implicated that the number of foreign materials, which becomes 2.25 times larger on the 300 nm silicon substrate than on the 200 nm substrate, exceeds the number that the first cleaning by use of ammonia water can remove.

Figure 19:
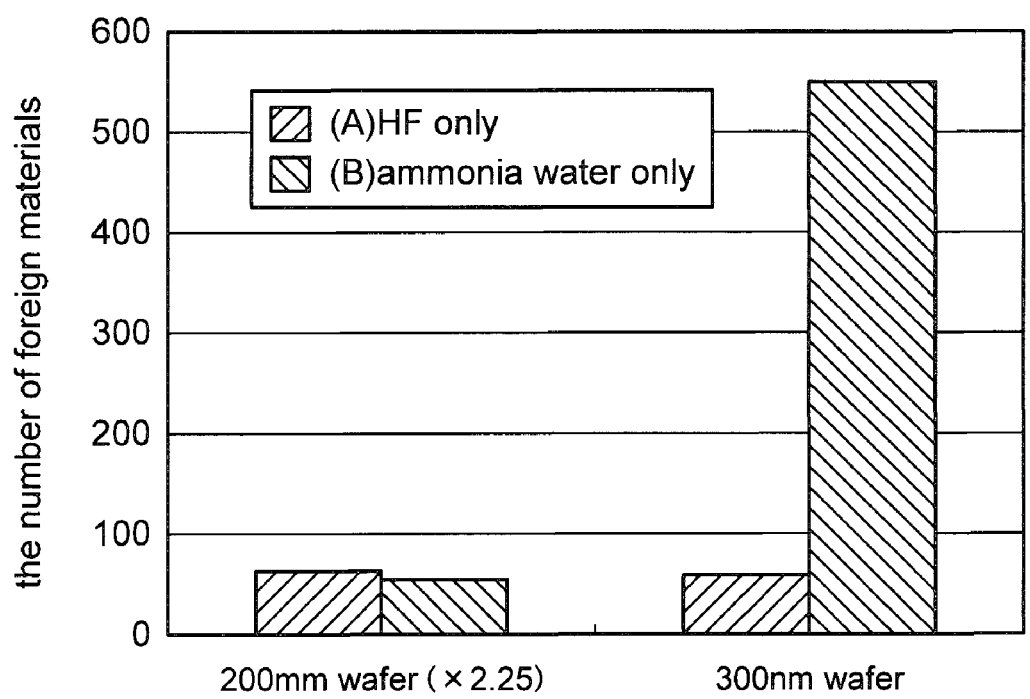
FIG. 19 is a graph showing the numbers of foreign materials in the case where investigation similar to that of FIG. 18 is carried out by using a slurry for a silicon oxide film, the slurry being different from that used in the investigation of FIG. 18.

FIG. 19 is a graph obtained by carrying out the investigation similar to that of FIG. 18 by changing the slurry for the silicon oxide film to STI2100, which is manufactured by DuPont Air Product NanoMaterials L.L.C. and is mainly formed of a cerium oxide abrasive grain, a surface active agent, and water.

As shown in FIG. 19, even with the different slurry, the large number of foreign materials remained on the silicon substrate with the wafer diameter of 300 mm when the cleaning was carried out only by use of ammonia water together with brushes 123.

Viewing only from the results of FIGS. 18 and 19, it seems that only a single step cleaning using hydrofluoric acid suffices for the cleaning process after the polishing.

However, in the actual processes for mass production of semiconductor devices, it is desired that the number of foreign materials be further reduced.

For this reason, the inventors of the present application compared the cleaning capability for the following cases: (C) cleaning by use of only hydrofluoric acid without brushes is carried out, (D) cleaning by use of hydrofluoric acid without brushes is firstly carried out and then cleaning by use of ammonia water with brushes is carried out, and (E) cleaning by use of hydrofluoric acid without brushes is firstly carried out and then cleaning by use of hydrofluoric acid with brushes is carried out.

Figure 20:
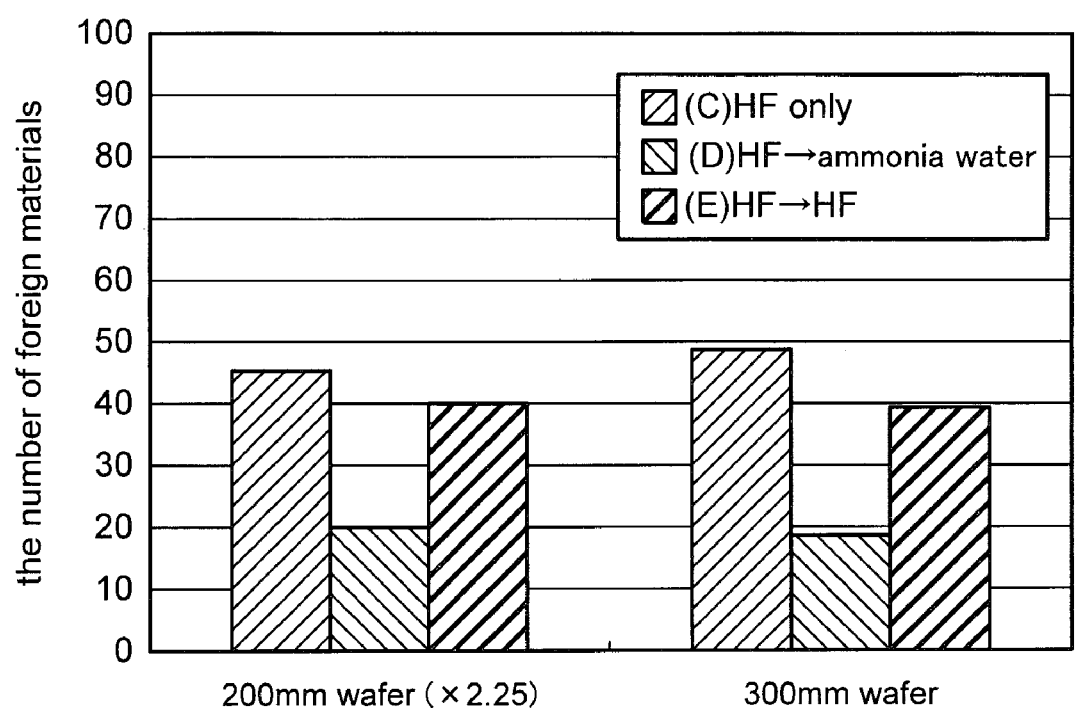
FIG. 20 is a graph obtained by investigating the numbers of foreign materials in the case where the silicon oxide film is cleaned by using a combination of cleaning fluids, the slurry being different from that used in the investigation of FIG. 18.

FIG. 20 shows the results.

Note that in the investigation of FIG. 20, similar to the investigation of FIG. 18, a silicon oxide film was formed by the plasma CVD method on a silicon substrate on which no pattern was formed, and thereafter the silicon oxide film was polished by a slurry Semi-Sperse SS25, which was manufactured by Cabot Corporation and mainly formed of silica, KOH, and water, and the cleaning was carried out on the polished silicon oxide film by the above-described methods (C) to (E).

As shown in FIG. 20, among the above-described three cases, the number of foreign materials became smallest in the case of (D).

Figure 21:
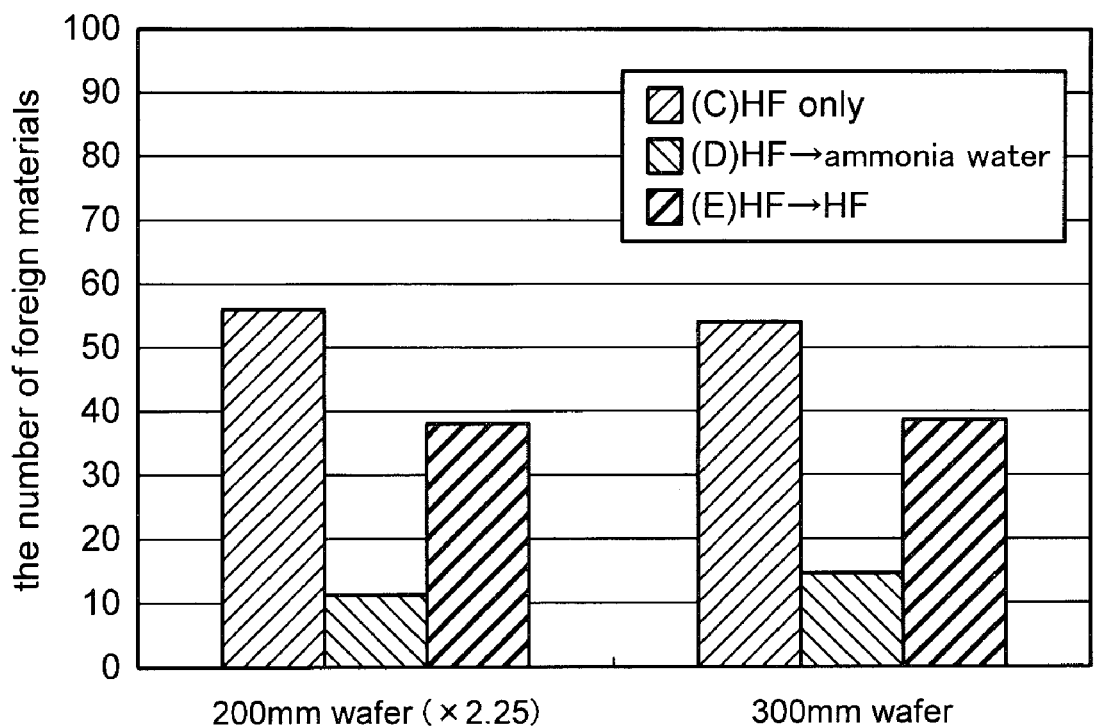
FIG. 21 is a graph obtained by investigating the numbers of foreign materials in the case where the investigation similar to that of FIG. 20 is carried out by using a slurry for a silicon oxide film, the slurry being different from that used in the investigation of FIG. 20.

FIG. 21 is a graph obtained by carrying out investigation similar to that of FIG. 20 by changing the slurry for the silicon oxide film to STI2100, which is manufactured by DuPont Air Products NanoMaterials L.L.C.

As shown in FIG. 21, the number of foreign materials after cleaning became smallest in the case (D) even when the slurry was changed.

Figure 22:
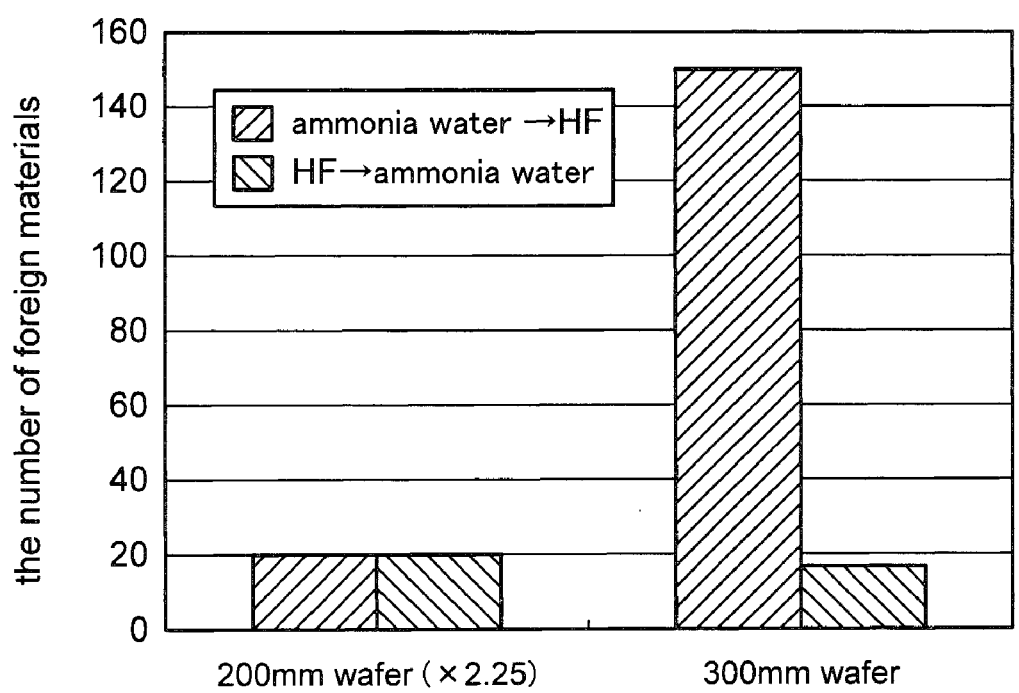
FIG. 22 is a graph obtained by investigating how the numbers of foreign materials change depending on the order of the cleaning carried out by use of ammonia water and hydrofluoric acid on a sample that is the same as that used in the investigation of FIG. 20.
Figure 23:
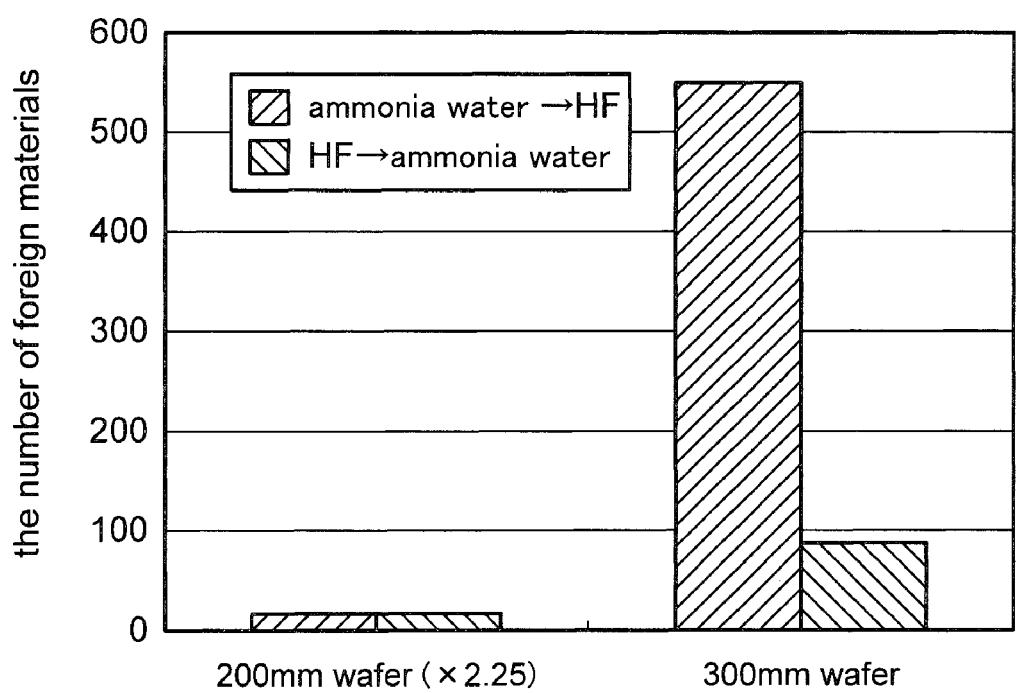
FIG. 23 is a graph obtained by investigating how the numbers of foreign materials change depending on the order of cleaning carried out by use of ammonia water and hydrofluoric acid on a sample that is the same as that used in the investigation of FIG. 21.

FIGS. 22 and 23 show the graphs obtained by investigating how the order of the cleaning steps affects the number of the foreign materials. In this investigation, the same samples as that used in FIGS. 20 and 21 was used, and two step cleaning by use of ammonia water and hydrofluoric acid was carried out.

As shown in the figures, in the case of the silicon substrate with the diameter of 300 mm, the number of foreign materials significantly decreases by carrying out cleaning by use of firstly hydrofluoric acid and then of ammonia water.

From the results of FIGS. 20 to 23, it became apparent that in the case of the silicon substrate with the wafer diameter of 300 mm, the number of foreign materials on the substrate could be greatly reduced by carrying out the first step of exposing the polished surface to hydrofluoric acid and the second step of exposing the polished surface to ammonia water in this order after CMP. Such cleaning order is a reverse of the commonly-accepted order in which cleaning by use of ammonia water is firstly carried out and then cleaning by use of hydrofluoric acid is carried out.

The possible reason why the cleaning effect can be obtained even when the cleaning order is reversed in this manner is considered follows. That is, the surfaces of the silicon oxide films, such as the device isolation insulating film 13 and the first interlayer insulating film 26, exposed on the polished surfaces S1 and S2 are slightly etched by hydrofluoric acid in the first step. Thus, the foreign materials adhered to the surfaces are lifted off and thus become easy to be removed in the following second step.

Here, in the first step, an acidic chemical solution like hydrofluoric acid is used as a cleaning fluid, and thus foreign materials in the cleaning fluid are attracted to the substrate due to $\zeta$ potential of foreign materials. Accordingly, it is considered that when cleaning brushes 123 are used in the first step, foreign materials adhered to the brushes 123 adhere again to the substrate, which reduces the effect of lifting off of the foreign materials. For this reason, it is preferable in the first step that the brushes 123 be not used, and that the polished surface be simply exposed to a cleaning fluid having an effect of etching the partial regions I and II in the surface to be polished.

In contrast, in the second step, an alkaline chemical solution like ammonia water is used as a cleaning fluid, and thus foreign materials in the cleaning fluid become repulsive against the substrate due to a $\zeta$ potential of the foreign materials. Accordingly, in the second step, it is less probable that the foreign materials adhere again to the substrate even when brushes 123 are used. Thus, it is preferable in the second step that brushes 123 be used together to maximize the effect of removing the foreign materials.

Figure 24:
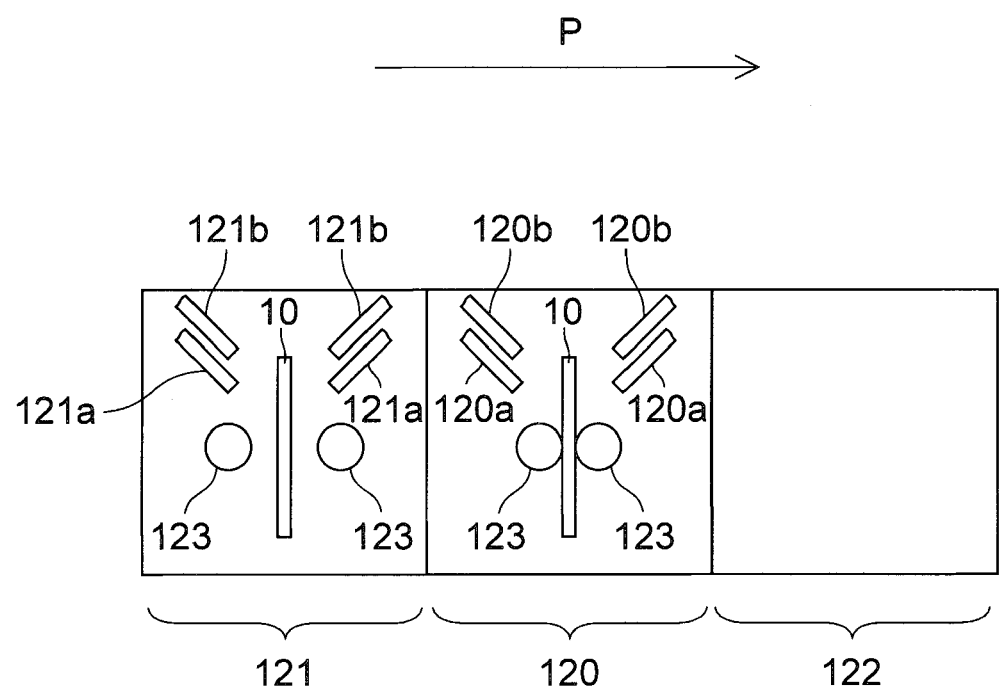
FIG. 24 is a cross-sectional view of a cleaning unit provided in the semiconductor manufacturing equipment according to one embodiment.

FIG. 24 is a cross-sectional view of a cleaning unit 100b in which cleaning can be carried out in the above-described cleaning order. Note that this cleaning unit 100b is provided in the semiconductor manufacturing equipment 100 described in FIG. 1.

This cleaning unit 100b differs from that of FIG. 3 in that the order of an ammonia cleaning tank 120 and a hydrofluoric acid cleaning tank 121 is changed. In the present example, a silicon substrate 10 is conveyed to the hydrofluoric acid cleaning tank 121, the ammonia cleaning tank 120, and a dryer tank 122 in this order along a conveyance path P in the figure.

In each of the cleaning tanks 120 and 121, the silicon substrate 10 is held in an upright position as shown in the figure. With this, a depth of the semiconductor manufacturing equipment 100 (see FIG. 1) can be smaller, so that the space of the semiconductor manufacturing equipment 100 can be reduced.

Furthermore, by holding the silicon substrate 10 in an upright position as described above, the cleaning fluid downwardly runs fast to the lower side of the silicon substrate 10 without staying on the surface of the substrate in each of the cleaning tanks 120 and 121. Thus, it becomes easy to prevent the foreign materials in the cleaning fluid from adhering again to the silicon substrate 10.

Figure 25:
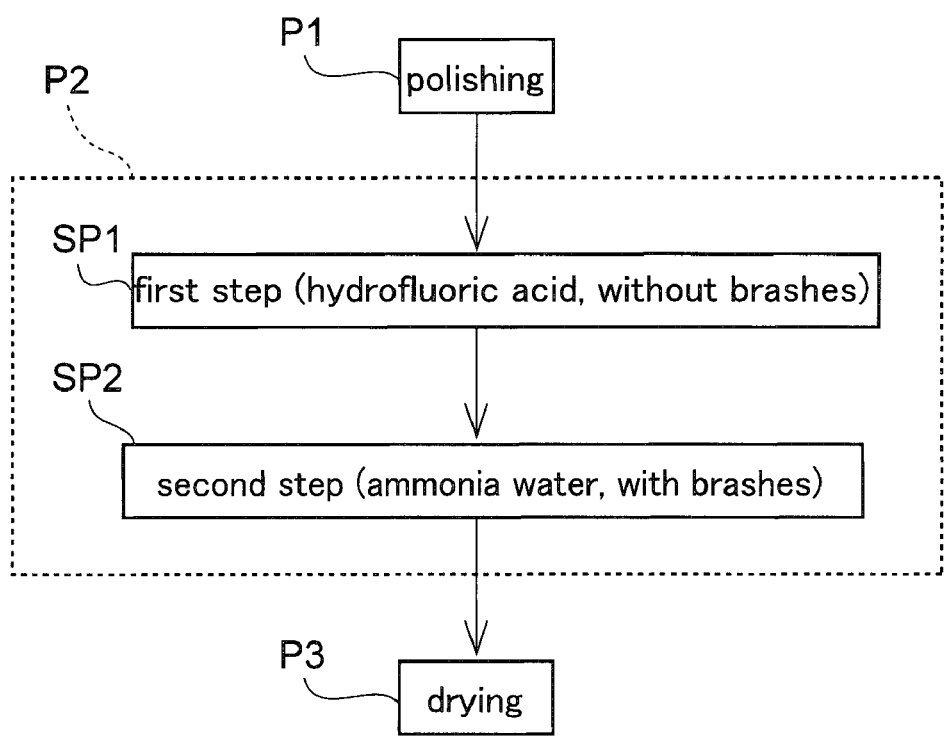
FIG. 25 is a flowchart of cleaning processes carried out in the cleaning unit of FIG. 24.

FIG. 25 is a flowchart of processes carried out in the semiconductor manufacturing equipment 100 provided with the above-described cleaning unit 100b. The processes are applied to the method for manufacturing a semiconductor device described in FIGS. 5A to 5D (first example) or the method for manufacturing a semiconductor device described in FIGS. 8A to 8F (second example), for example.

In the first step P1 of FIG. 25, polishing is carried out on a film to be polished in the polishing unit 100a. In this polishing process, the polishing of the device isolation insulating film 13 as described in FIG. 5D or the polishing of the tungsten film 31 as described in FIGS. 8C and 8D is carried out.

Next, proceeding to step P2, cleaning of the polished surfaces S1 (see FIG. 5D) and S2 (see FIG. 8D) is carried out in two steps in the cleaning unit 100b. In the first step SP1, the polished surfaces S1 and S2 are cleaned by use of hydrofluoric acid with a concentration of approximately 0.5% in the hydrofluoric acid cleaning tank 121. Subsequently, in the second step SP2, the polished surfaces S1 and S2 are cleaned by use of ammonia water with a concentration of 0.1% in the ammonia cleaning tank 120.

Thereafter, proceeding to step P3, the polished surfaces are dried by either spin drying or IPA drying in the dryer tank 122.

As described above, by carrying out the first step SP1 and the second step SP2 in this order, foreign materials adhered to the silicon substrate with the diameter of 300 mm can be greatly reduced as shown in the investigation results of FIGS. 20 to 23, when compared with the case where the cleaning is carried out in the reversed order.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device, comprising:
    forming a film over a semiconductor substrate;
    polishing the film; and
    cleaning a polished surface, which is formed by the polishing, by carrying out
        a first exposing the polished surface to an acidic first cleaning fluid having an effect of etching at least a partial region of the polished surface; and
        a second exposing the polished surface to an alkaline second cleaning fluid after the first exposing.

2. The method according to claim 1, wherein the first exposing and the second exposing are carried out while holding the semiconductor substrate in an upright position.

3. The method according to claim 1, wherein the first exposing is carried out without applying a cleaning brush to the polished surface.

4. The method according to claim 1, wherein the second exposing is carried out while applying a cleaning brush to the polished surface.

5. The method according to claim 1, wherein a silicon oxide film is exposed in the partial region of the polished surface, and hydrofluoric acid is used as the first cleaning fluid.

6. The method according to claim 1, wherein ammonia water is used as the second cleaning fluid.

7. The method according to claim 1, wherein a stepped portion is formed by the polishing in the polished surface in a boundary between the partial region and another region adjacent to the partial region.

8. The method according to claim 1, wherein the polished surface is constructed from a silicon nitride film formed in another region adjacent to the partial region and a silicon oxide film formed in the partial region.

9. The method according to claim 8, further comprising:
    forming the silicon nitride film over the silicon semiconductor substrate;
    forming an opening in the silicon nitride film in the partial region; and
    forming a device isolation groove by etching the semiconductor substrate through the opening, wherein
    when forming the film, the silicon oxide film is formed in the device isolation groove and over the silicon nitride film as the film, and
    when polishing the film, the silicon oxide film is polished to be left in the device isolation groove as a device isolation insulating film, while using the silicon nitride film as a polishing stopper film.

10. The method according to claim 1, wherein the polished surface is constructed from a tungsten film formed in another region adjacent to the partial region and a silicon oxide film formed in the partial region.

11. The method according to claim 10, further comprising:
    forming the silicon oxide film over the semiconductor substrate; and
    forming a hole in the silicon oxide film in a portion other than the partial region, wherein
    when forming the film, the tungsten film is formed in the hole and over the silicon oxide film as the film, and
    when polishing the film, the tungsten film is polished to be left in the hole as a conductive plug, and the silicon oxide film is exposed in the partial region.

12. The method according to claim 11, wherein the polishing of the tungsten film comprises:
    a first polishing using a slurry in which a polishing rate of the tungsten film is faster than a polishing rate of the silicon oxide film; and
    a second polishing using a slurry in which a polishing rate of the silicon oxide film is faster than a polishing rate of the tungsten film, after the first polishing step.

* * * * *